United States Patent
Jang et al.

(10) Patent No.: US 8,697,498 B2
(45) Date of Patent: Apr. 15, 2014

(54) METHODS OF MANUFACTURING THREE DIMENSIONAL SEMICONDUCTOR MEMORY DEVICES USING SUB-PLATES

(75) Inventors: Byong-hyun Jang, Suwon-si (KR); Dongchul Yoo, Seongnam-si (KR); Chanjin Park, Yongin-si (KR); Hanmei Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 81 days.

(21) Appl. No.: 13/284,435

(22) Filed: Oct. 28, 2011

(65) Prior Publication Data
US 2012/0135583 A1    May 31, 2012

(30) Foreign Application Priority Data

Nov. 29, 2010  (KR) .................. 10-2010-0119904

(51) Int. Cl.
*H01L 21/82* (2006.01)
*H01L 21/00* (2006.01)

(52) U.S. Cl.
USPC ........... 438/128; 438/154; 438/217; 438/257; 438/588; 438/591; 257/E29.052

(58) Field of Classification Search
USPC ................. 438/128, 154, 217, 257, 588, 591; 257/E29.052
See application file for complete search history.

(56) References Cited

U.S. PATENT DOCUMENTS

| | | | |
|---|---|---|---|
| 7,679,133 B2 | 3/2010 | Son et al. | |
| 2006/0076602 A1* | 4/2006 | Harter et al. | 257/301 |
| 2007/0158736 A1* | 7/2007 | Arai et al. | 257/315 |
| 2007/0252201 A1* | 11/2007 | Kito et al. | 257/331 |
| 2008/0265235 A1 | 10/2008 | Kamigaichi et al. | |
| 2009/0242966 A1 | 10/2009 | Son et al. | |

FOREIGN PATENT DOCUMENTS

| | | |
|---|---|---|
| JP | 2008-277543 | 11/2008 |
| JP | 2009-117843 | 5/2009 |
| KR | 1020080096432 A | 10/2008 |
| KR | 1020090047614 A | 5/2009 |
| KR | 1020090093770 A | 9/2009 |

* cited by examiner

*Primary Examiner* — Thanh V Pham
(74) *Attorney, Agent, or Firm* — Myers Bigel Sibley & Sajovec, P.A.

(57) ABSTRACT

A method of manufacturing a Three Dimensional (3D) semiconductor memory device can be provided by forming at least one trench in a plate stack structure to divide the plate stack structure into a plurality of sub-plate stack structures between forming a plurality of vertical active patterns in the plate stack structure and forming pads of a stepped structure from the plate stack structure.

10 Claims, 39 Drawing Sheets

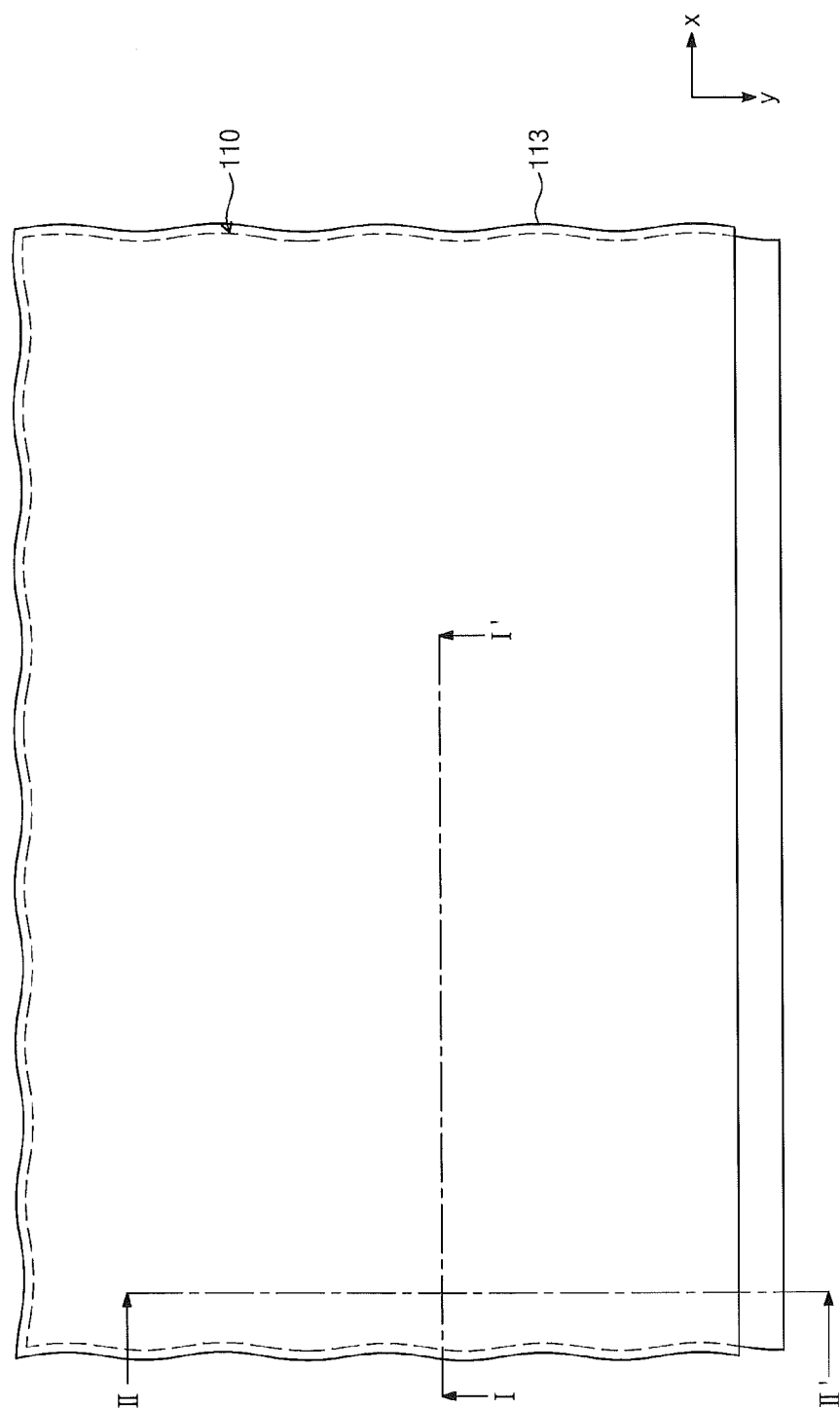

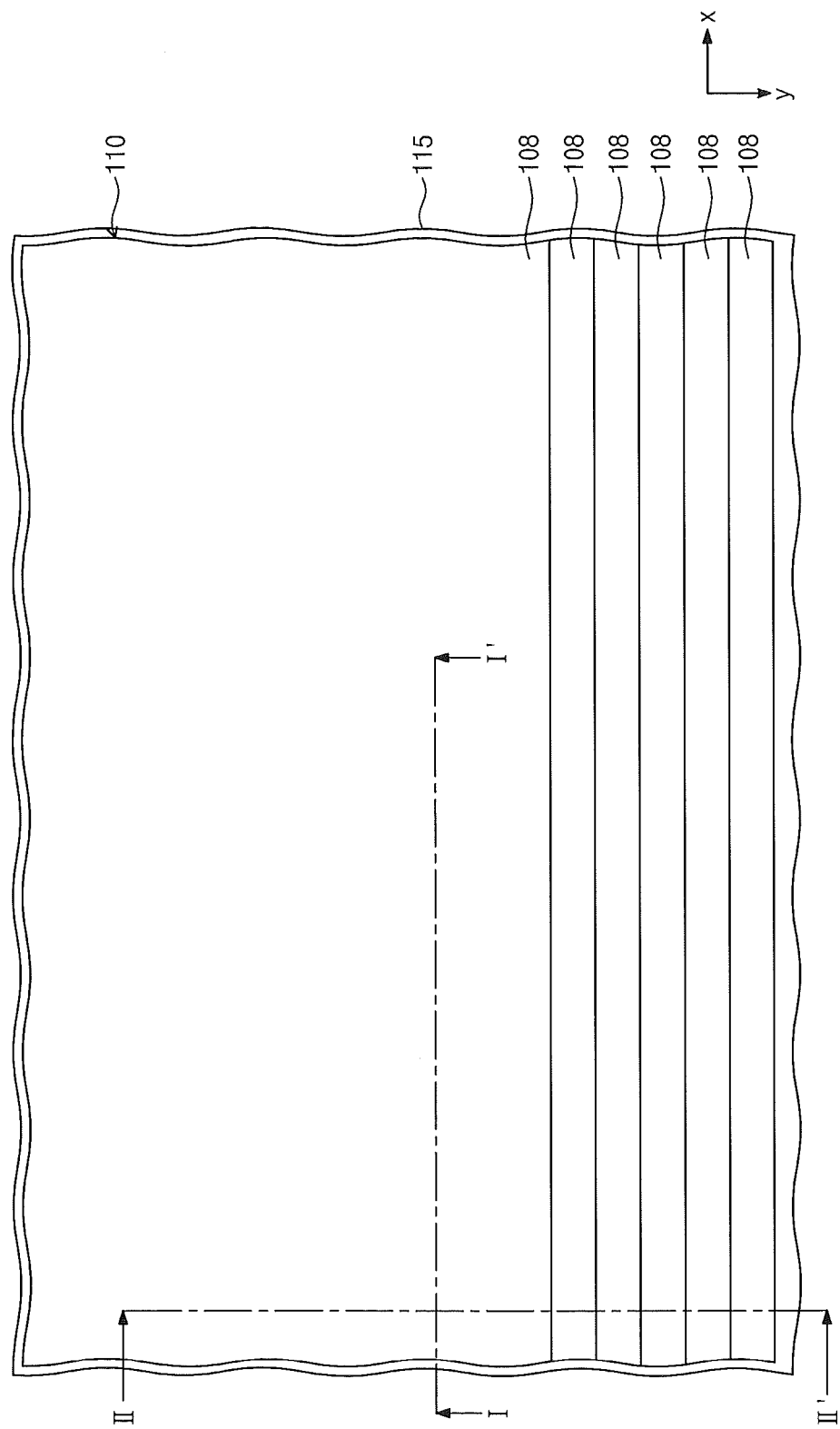

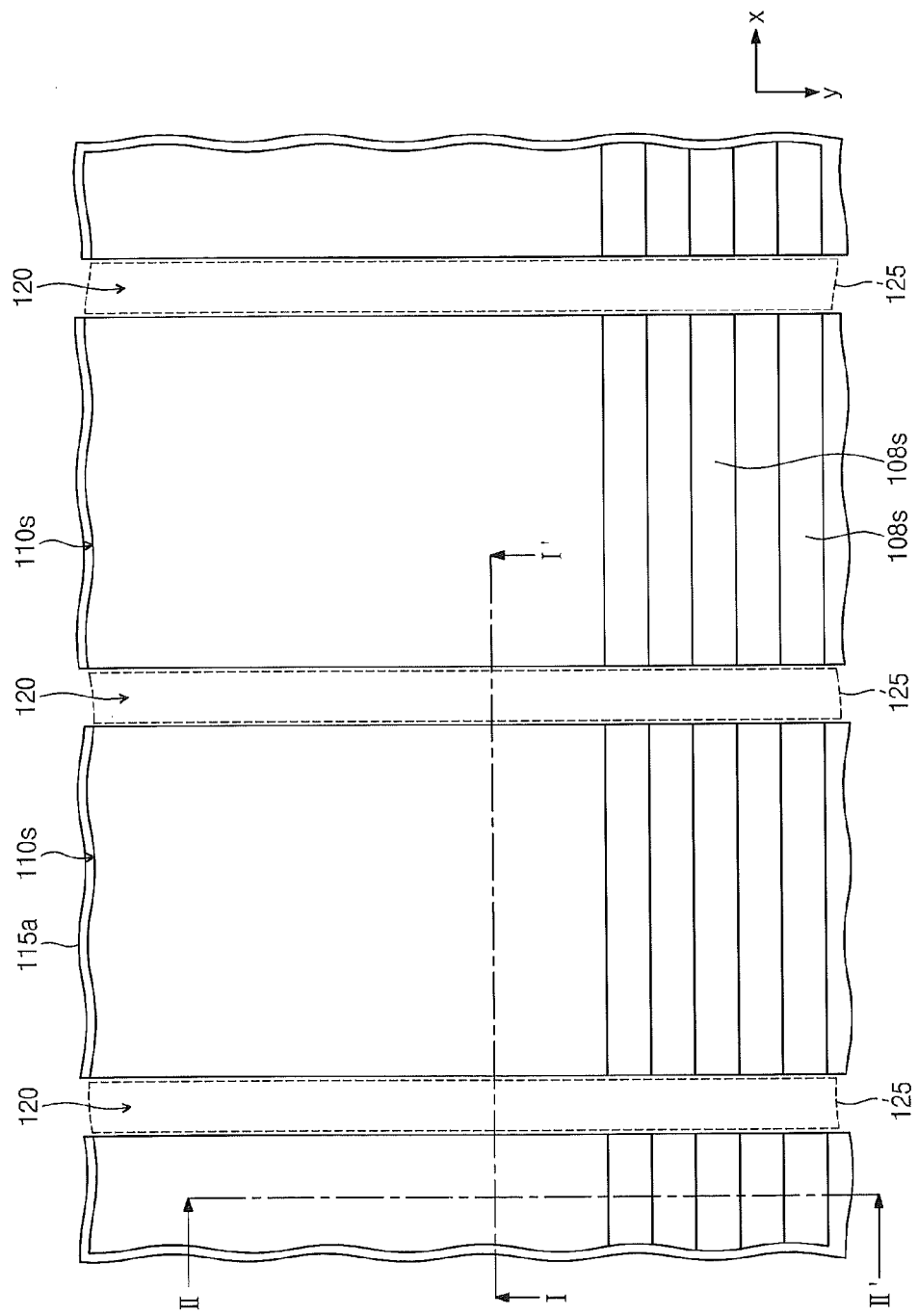

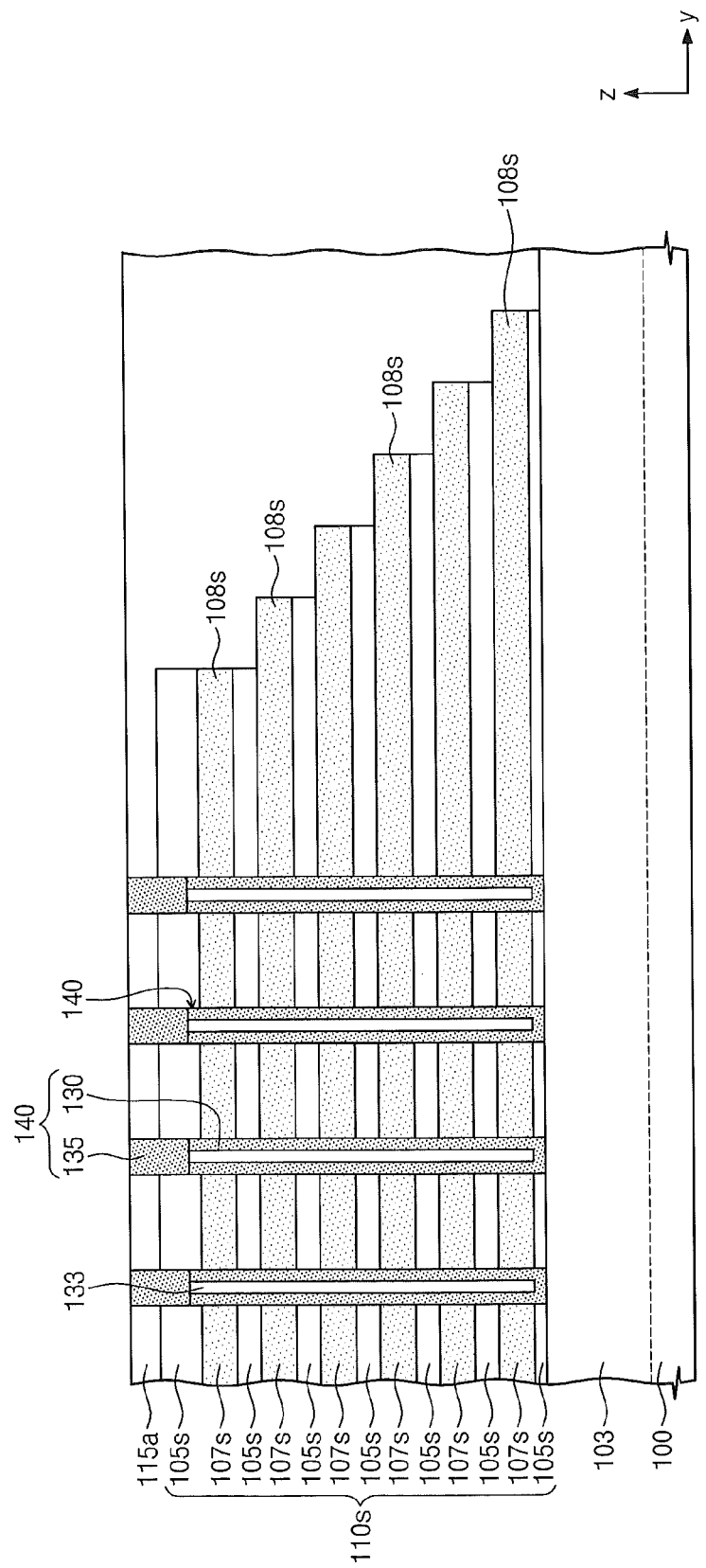

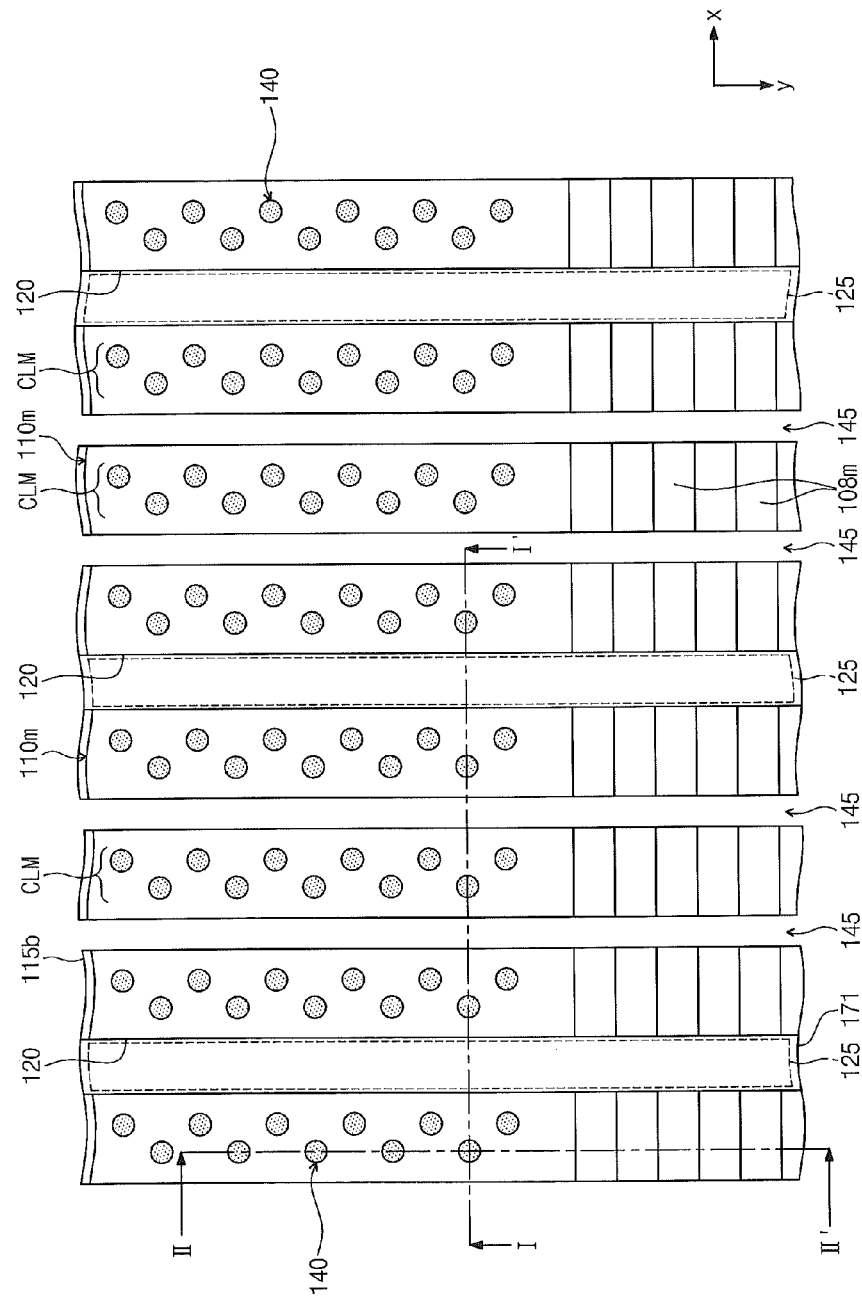

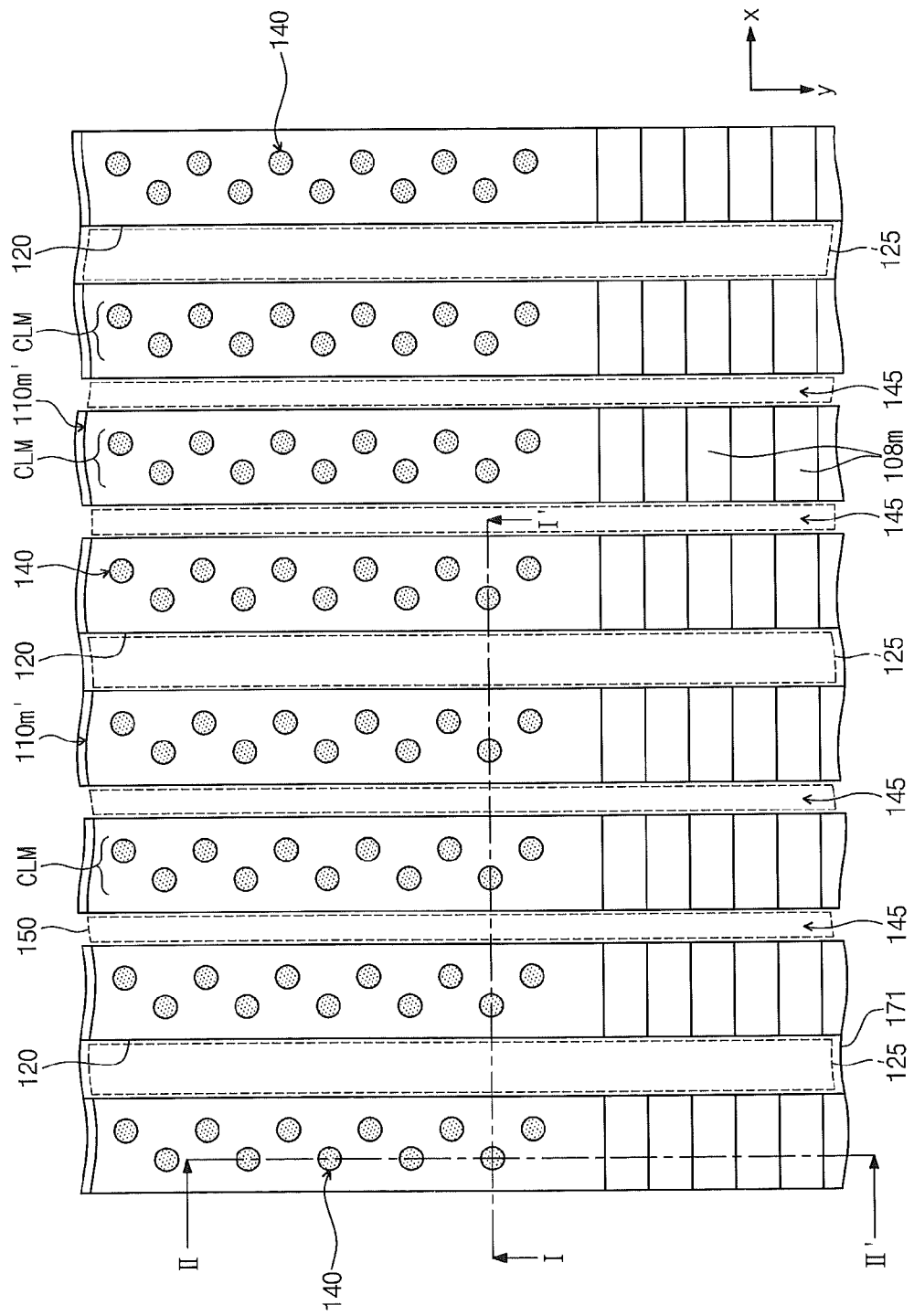

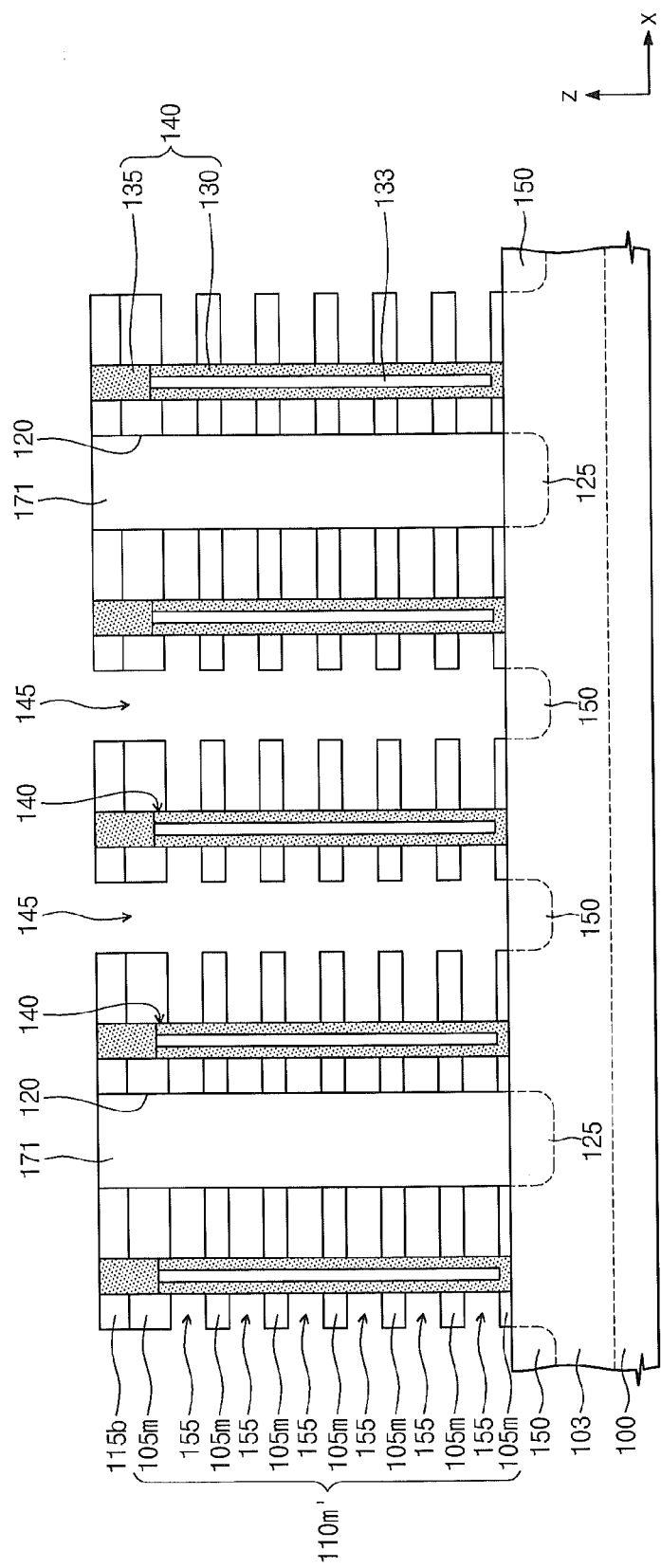

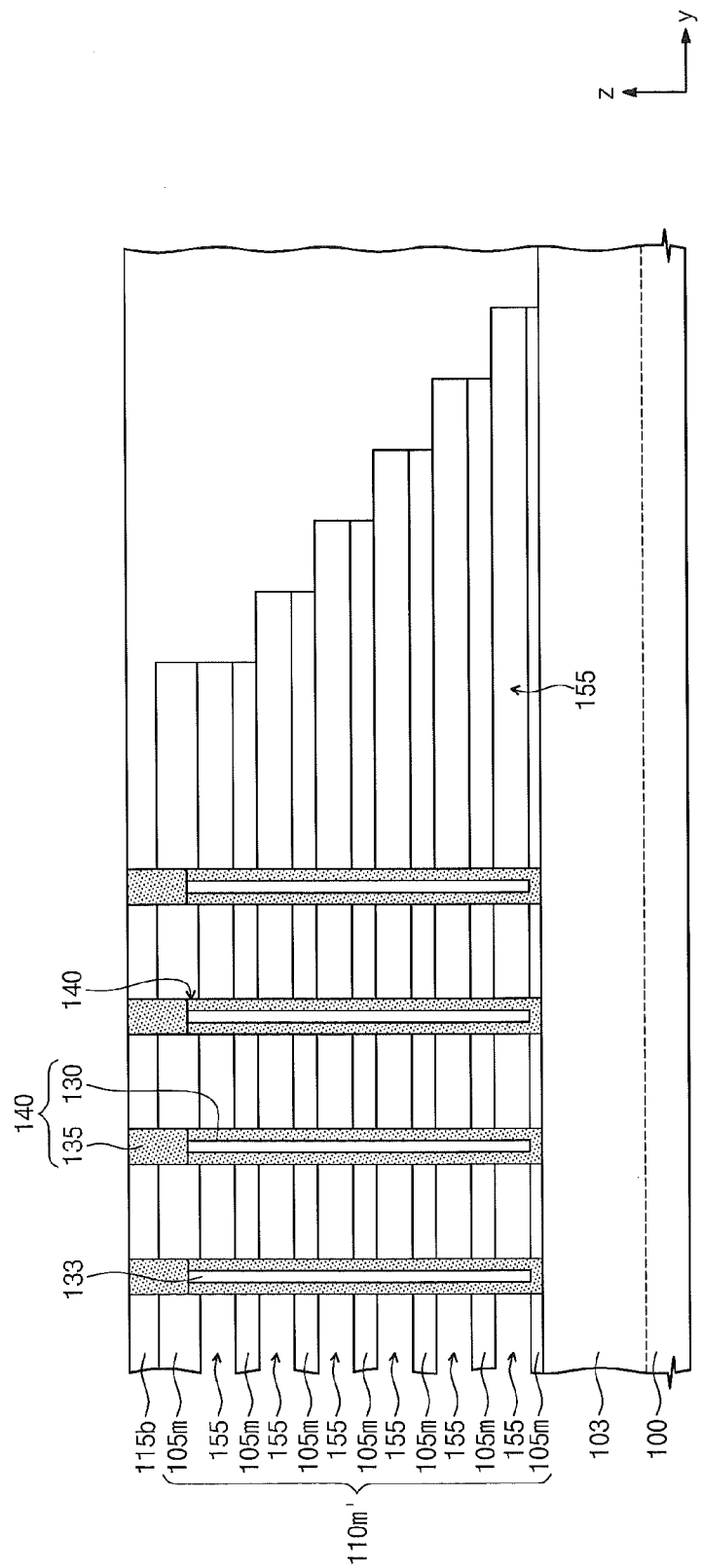

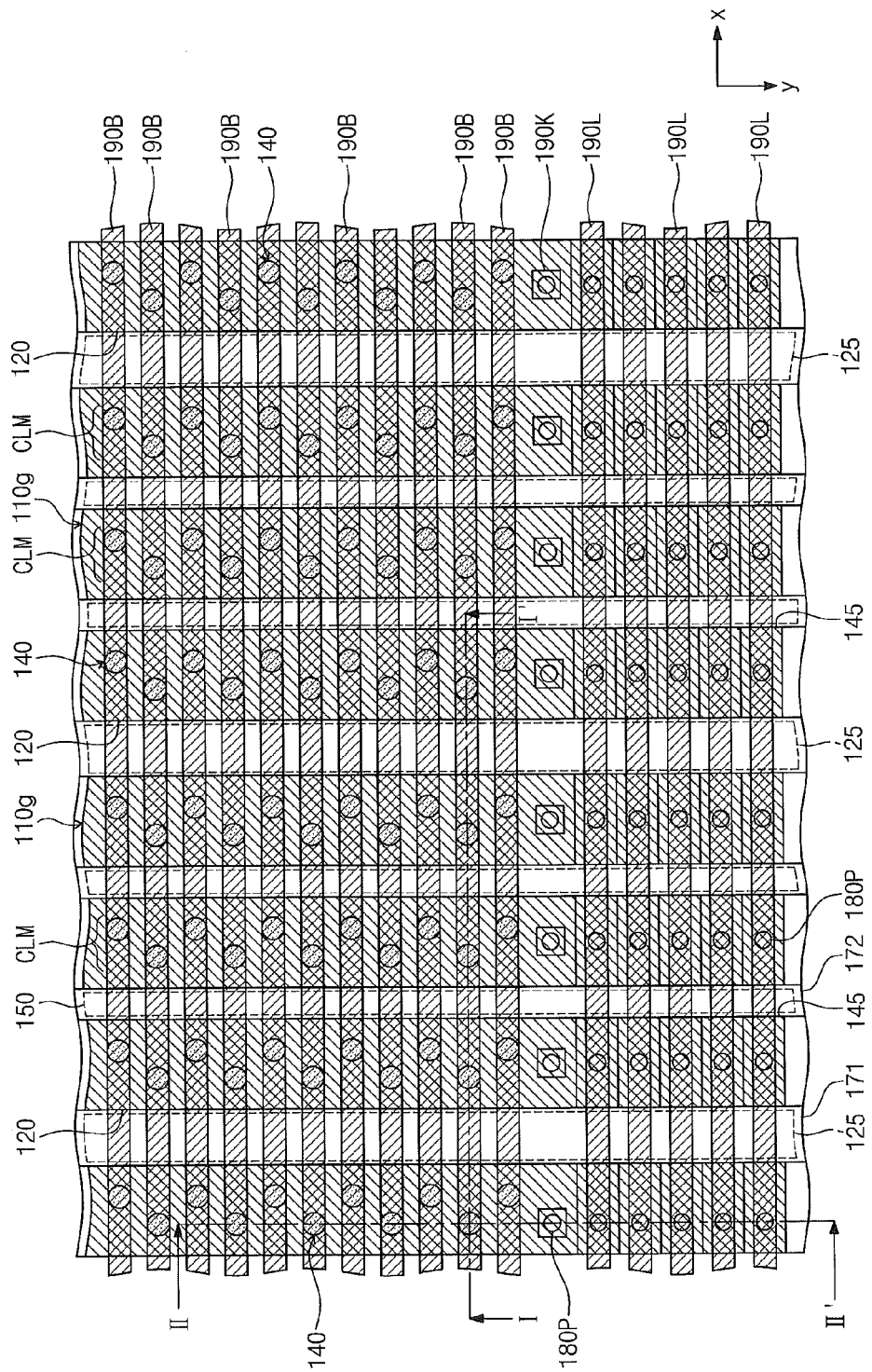

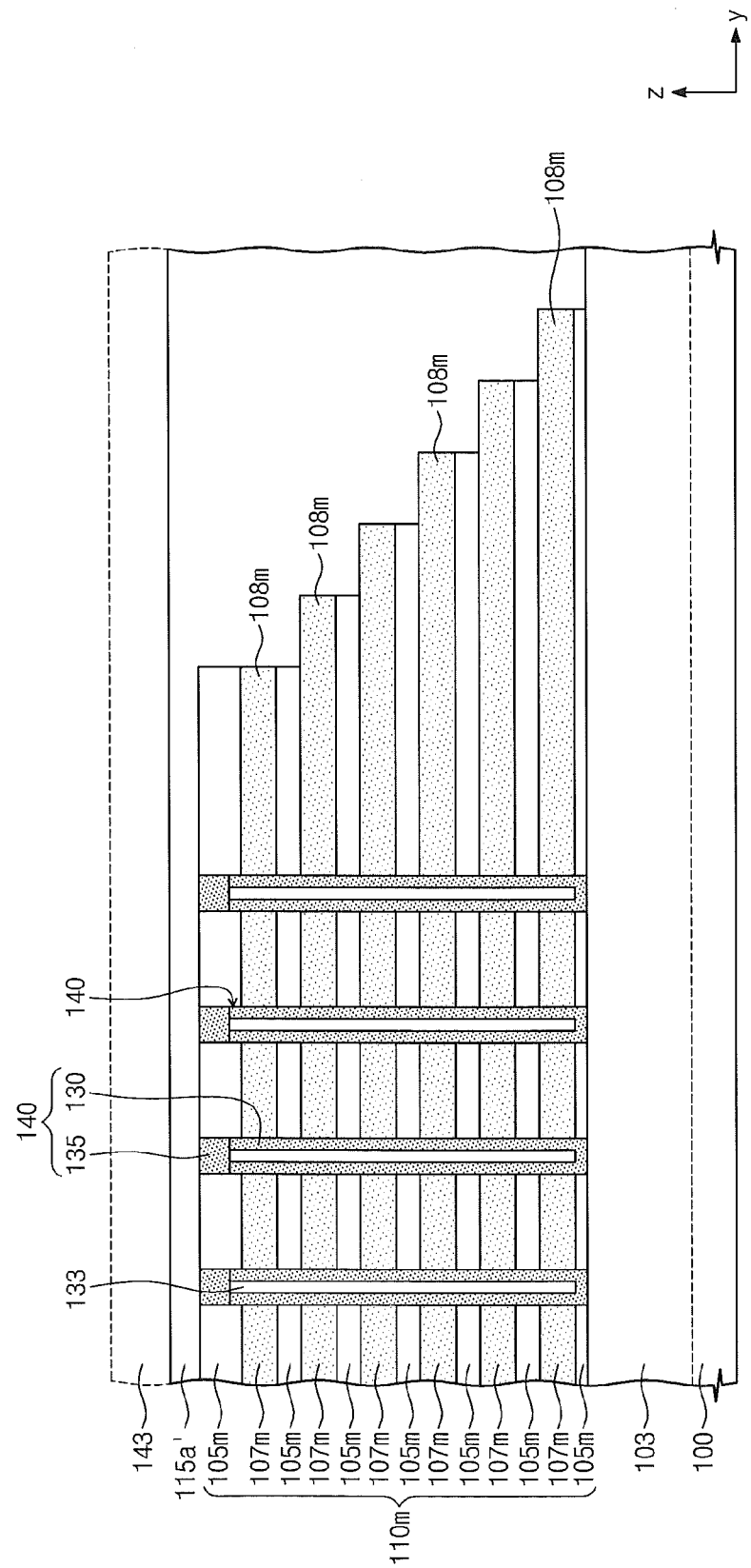

METHODS OF MANUFACTURING THREE DIMENSIONAL SEMICONDUCTOR MEMORY DEVICES USING SUB-PLATES

CROSS-REFERENCE TO RELATED APPLICATIONS

This U.S. non-provisional patent application claims priority under 35 U.S.C. §119 of Korean Patent Application No. 10-2010-0119904, filed on Nov. 29, 2010, the entire contents of which are hereby incorporated herein by reference.

BACKGROUND

The present disclosure herein relates to a method of fabricating a semiconductor device, and more particularly, to a method of fabricating a Three Dimensional (3D) semiconductor memory device.

Generally, the surface area of a unit memory cell is a factor in determining a degree of integration of a semiconductor memory device. Due to this, a degree of integration of a semiconductor memory device may be affected by the ability of manufacturing technology to produce fine patterns.

SUMMARY

Embodiments of the inventive concept may provide methods of manufacturing a Three Dimensional (3D) semiconductor memory device by forming a plate stack structure including a plurality of plate insulation patterns and plate sacrificial patterns which are stacked alternately and repeatedly on a substrate. Edges of the plate sacrificial patterns can be formed as pads included in a stepped structure. At least one first trench can be formed to divide the plate stack structure including the pads into a plurality of sub-plate stack structures. A plurality of vertical active patterns can be formed to pass through each of the sub-plate stack structures and at least one second trench can be formed to divide each of the sub-plate stack structures to provide a plurality of mold-stack structures.

In some embodiments according to the invention, the method can also include forming a capping dielectric layer which covers the pads, before the first trench is formed. The first trench can be formed by patterning the plate stack structure including the pads and the capping dielectric layer, where the sub-plate stack structure includes sub-pads providing a stepped structure that are divided from the pads of the plate sacrificial patterns. The second trench can be formed by patterning the sub-plate stack structure and a portion of the capping dielectric layer covering the sub-pads.

In some embodiments according to the invention, the mold-stack structure can include a plurality of mold insulation patterns and mold sacrificial patterns which are stacked alternately and repeatedly, where the mold sacrificial patterns can be removed to form a plurality of gap regions. A multi-layered dielectric layer can be formed on sidewalls of the plurality of gap regions and a plurality of gate patterns can be formed in the gap regions on the multi-layered dielectric layer.

In some embodiments according to the invention, a first isolation pattern can be formed to fill the first trench before the vertical active patterns are formed and a second isolation pattern can be formed to fill the second trench after the gate patterns are formed. In some embodiments according to the invention, the first and second trenches extend in a first direction and the first trench has a first width in a second direction perpendicular to the first direction. The second trench can have a second width in the second direction and the first width can be different from the second width.

In some embodiments according to the invention, the vertical active patterns can pass though each of the sub-plate stack structures and are divided into a plurality of column groups, in a plan view. The second trench can be formed between a pair of the column groups that are adjacent to each other and the vertical active patterns in each of the column groups can pass through each of the mold-stack structures.

In some embodiments according to the invention, the vertical active patterns in the each of the column groups can be are arranged in a first direction and odd-numbered vertical active patterns can be offset in a second direction, perpendicular to the first direction relative to even-numbered vertical active patterns.

In some embodiments according to the invention, a well region can be doped with a first conductive dopant, in the substrate. A first doped-region can be formed in a well region under the first trench and a second doped-region can be doped with a second conductive dopant, in a well region under the second trench. In some embodiments according to the invention, the first doped-region can be doped with the first conductive dopant and a dopant concentration of the first doped-region can be higher than a dopant concentration of the well region. In some embodiments according to the invention, the second doped-region is doped with the second conductive dopant.

In some embodiments according to the invention, a method of manufacturing a Three Dimensional (3D) semiconductor memory device can be provided by forming a plate stack structure that includes a plurality of plate insulation patterns and plate sacrificial patterns which are stacked alternately and repeatedly on a substrate. A plurality of vertical active patterns can be formed to pass through the plate stack structure. At least one first trench can be formed to divide the plate stack structure that includes the plurality of vertical active patterns, into a plurality of sub-plate stack structures, where each of the sub-plate stack structures can include a plurality of sub-plate insulation patterns and sub-plate sacrificial patterns which are stacked alternately and repeatedly. Edges of the sub-plate sacrificial patterns can be formed as pads of a stepped structure and at least one second trench can be formed to divide the respective sub-stack structures including the pads into a plurality of mold-stack structures.

In some embodiments according to the inventive concept, a method of manufacturing a Three Dimensional (3D) semiconductor memory device can be provided by forming at least one trench in a plate stack structure to divide the plate stack structure into a plurality of sub-plate stack structures between forming a plurality of vertical active patterns in the plate stack structure and forming pads of a stepped structure from the plate stack structure.

In some embodiments according to the invention, the plurality of vertical active patterns can be formed in the plate stack structure before forming the at least one trench in the plate stack structure. In some embodiments according to the invention, the pads of the stepped structure can be formed from the plate stack structure after forming the at least one trench in the plate stack structure.

In some embodiments according to the invention, the pads of the stepped structure can be formed from the plate stack structure before forming the at least one trench in the plate stack structure. In some embodiments according to the invention, the plurality of vertical active pattern can be formed in the plate stack structure after forming the at least one trench in the plate stack structure.

BRIEF DESCRIPTION OF THE DRAWINGS

FIGS. 1A to 8A are a plan views illustrating methods of manufacturing a 3D semiconductor memory device according to an embodiment of the inventive concept.

FIGS. 1B to 8B are sectional views taken along line I-I' of FIGS. 1A to 8A, respectively.

FIGS. 1C to 8C are sectional views taken along line II-II' of FIGS. 1A to 8A, respectively;

FIGS. 9A to 13A are a plan views illustrating methods of manufacturing a 3D semiconductor memory device according to another embodiment of the inventive concept.

FIGS. 9B to 13B are sectional views taken along line III-III' of FIGS. 9A to 13A, respectively.

FIGS. 9C to 13C are sectional views taken along line IV-IV' of FIGS. 9A to 13A, respectively.

DETAILED DESCRIPTION

Figure 1B:
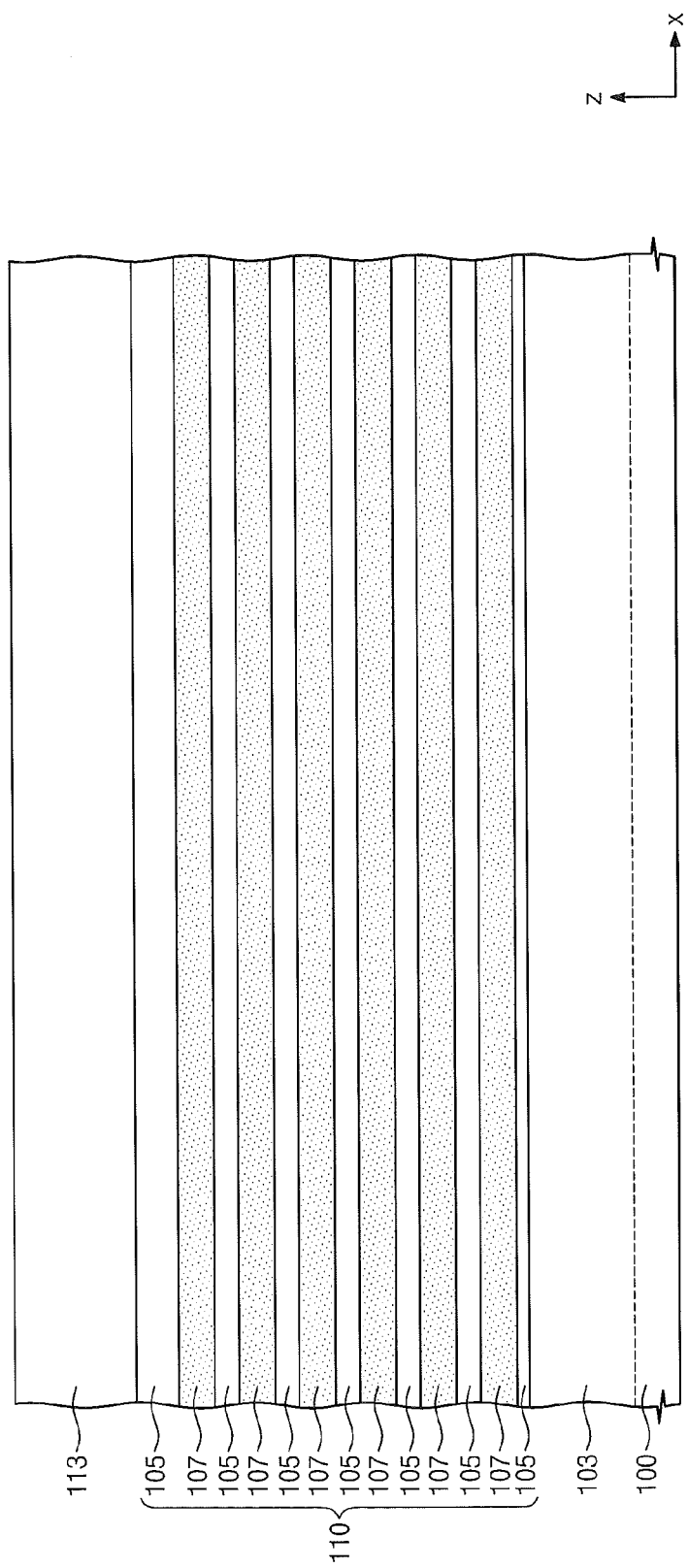

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the specification, it will be understood that when an element such as a layer, film, region, or substrate is referred to as being "on" another element, it can be directly on the other element or intervening elements may also be present. In the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. In the specification, the term 'and/or' is used as meaning in which the term includes at least one of preceding and succeeding elements. Like reference numerals refer to like elements throughout.

(First Embodiment)

FIGS. 1A to 8A are a plan views illustrating a method of manufacturing a 3D semiconductor memory device according to an embodiment of the inventive concept. FIGS. 1B to 8B are sectional views taken along line I-I' of FIGS. 1A to 8A, respectively. FIGS. 1C to 8C are sectional views taken along line II-II' of FIGS. 1A to 8A, respectively.

Figure 1C:
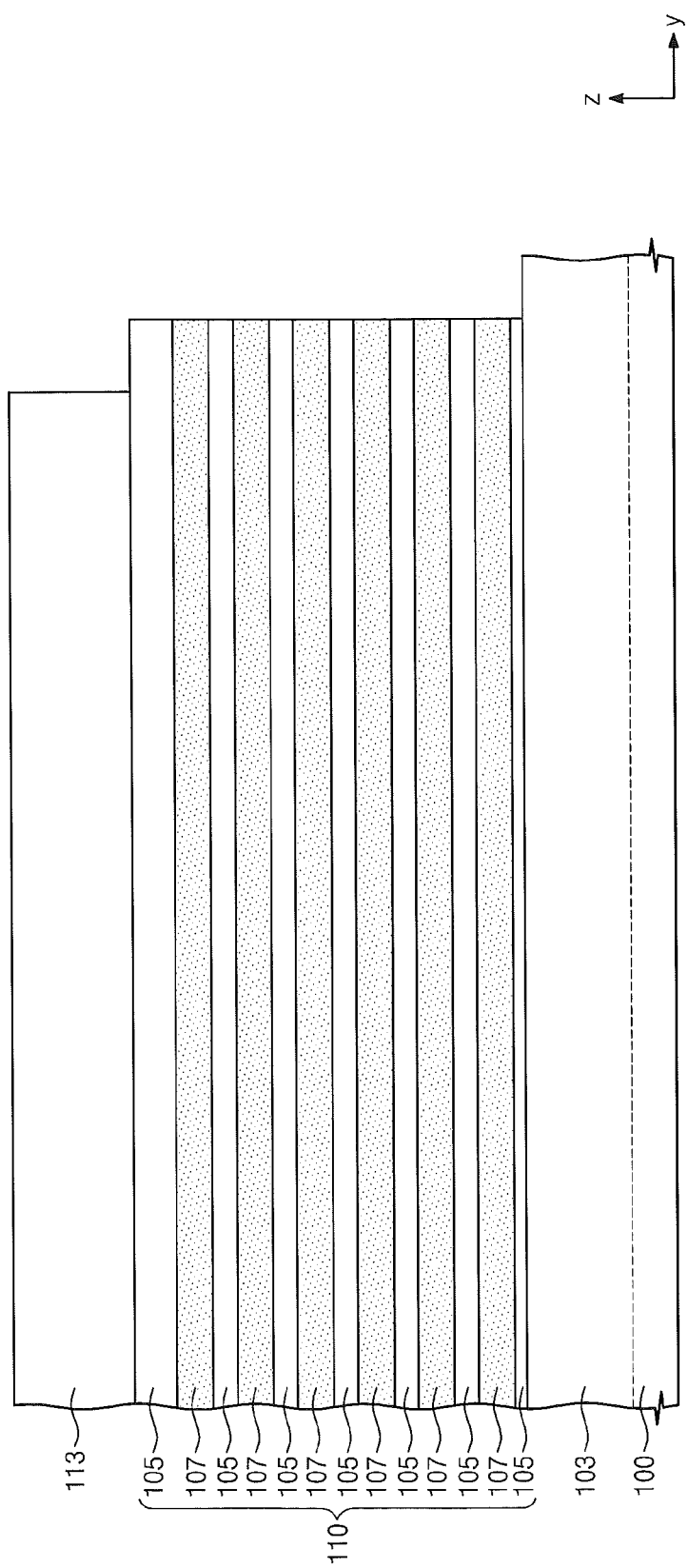

Referring to FIGS. 1A to 1C, a well region 103 may be formed by providing a first conductive dopant in a semiconductor substrate 100 (hereinafter referred to as a substrate). The substrate 100 may be a silicon substrate, a germanium substrate, or a silicon-germanium substrate. A plate stack structure 110 may be formed on the substrate 100. The plate stack structure 110 may include a plurality of plate insulation patterns 105 and plate sacrificial patterns 107 that are stacked alternately and repeatedly on the substrate 100. The plate stack structure 110 may be formed on the well region 103. The plate sacrificial patterns 107 may include a material having an etch selectivity with respect to the plate insulation patterns 105. For example, if the plate insulation patterns 105 are formed of oxide, the plate sacrificial patterns 107 may be formed of nitride. A plurality of insulation layers and a plurality of sacrificial layers may be alternately and repeatedly stacked on the substrate 100, and thereafter, the stacked insulation layers and sacrificial layers may be patterned to form the plate stack structure 110. Therefore, as illustrated in FIG. 1C, the patterns 105 and 107 in the plate stack structure 110 may have sidewalls that are aligned with each other.

A plurality of pads having a stepped structure may be formed at an edge of the plate stack structure 110. According to an embodiment of the inventive concept, a pad mask pattern 113 may be formed on the plate stack structure 110. The pad mask pattern 113 may define a pad of a lowermost plate sacrificial pattern of the plate sacrificial patterns 107 in the plate stack structure 110.

Referring to FIGS. 1A to 1C and 2A to 2C, edges of the plate insulation patterns 105 and plate sacrificial patterns 107 disposed on the lowermost plate sacrificial pattern may be etched using the pad mask pattern 113 as an etch mask. Therefore, an edge of the lowermost plate sacrificial pattern may be exposed. The exposed edge of the lowermost plate sacrificial pattern may correspond to a pad 108 of the lowermost plate sacrificial pattern.

The pad mask pattern 113 may be isotropic-etched. A sidewall of the pad mask pattern 113 may be laterally etched by the isotropic etching. Therefore, the isotropic-etched pad mask pattern may define a pad of a plate sacrificial pattern that is second from a top surface of the substrate 100. Plate insulation patterns 105 and plate sacrificial patterns 107 disposed on the secondary stacked plate sacrificial pattern may be etched using the isotropic-etched pad mask pattern as an etch mask. Therefore, an edge of the secondary stacked plate sacrificial pattern may be exposed. The edge of the secondary stacked plate sacrificial pattern corresponds to a pad 108 of the secondary stacked plate sacrificial pattern. Such an isotropic etching process for the pad mask pattern and an etching process (which uses the isotropic-etched pad mask pattern as an etch mask) for the plate insulation pattern 105 and the plate sacrificial pattern 107 may be performed repeatedly. Therefore, the plate sacrificial patterns 107 may be formed to have pads 108 constituting a stepped structure. In other words, the pads 108 providing the stepped structure may be formed using the pad mask pattern 113 as a consumptive mask.

Figure 2B:
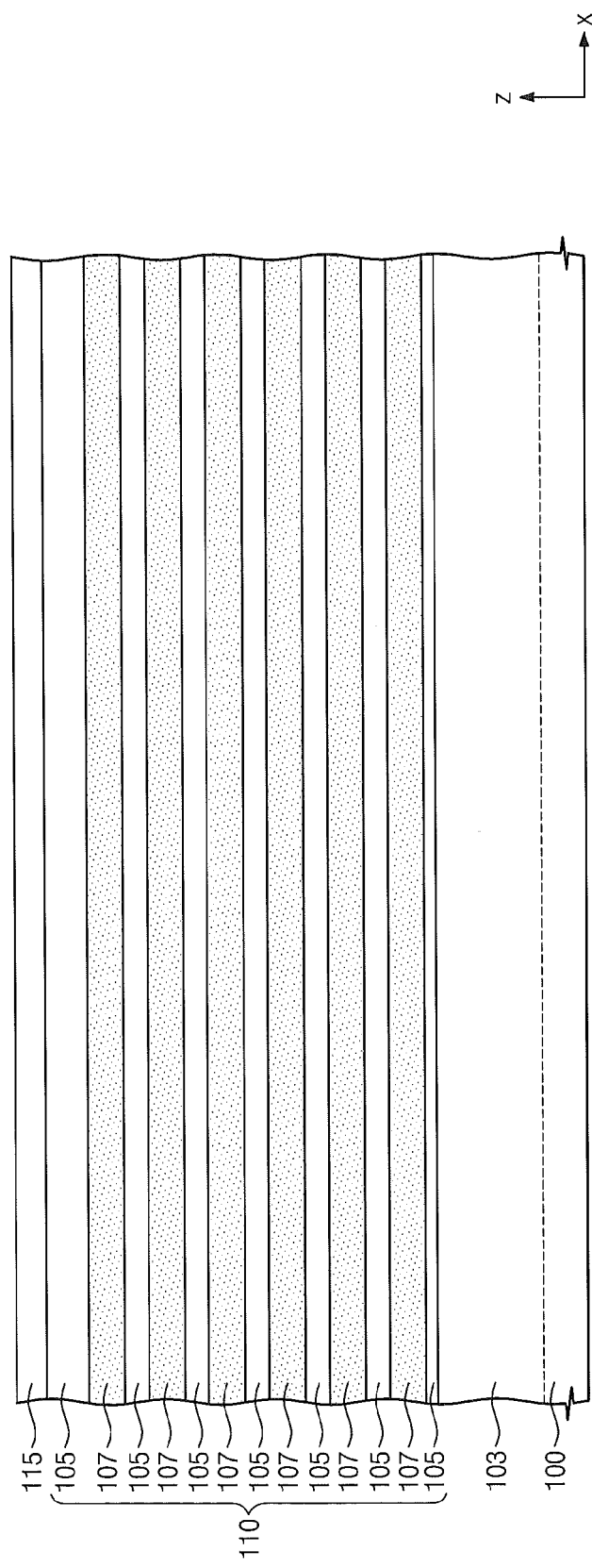
Figure 2C:
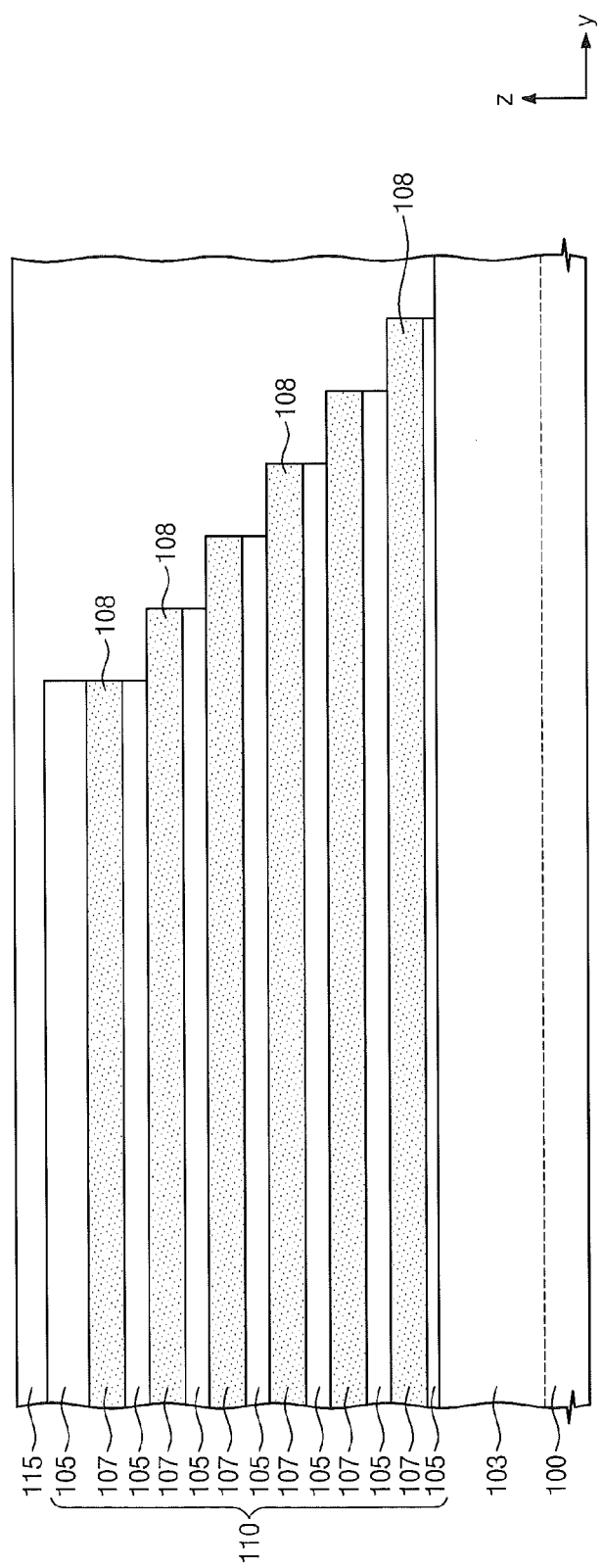

As disclosed in FIGS. 2A and 2C, the pads 108 of the plate sacrificial patterns 107 may have a downwardly stepped structure in a first direction. In a plan view, the pads 108 of the plate sacrificial patterns 107 may be extended side by side in a second direction perpendicular to the first direction. The first direction may correspond to a y axis in FIG. 2A, and the second direction may correspond to an x axis in FIG. 2A.

After formation of the pads 108 providing the stepped structure, any remaining portion of the pad mask pattern may be removed.

Subsequently, a capping dielectric layer 115 may be formed on the substrate 100. According to FIG. 2C, the capping dielectric layer 115 may cover the pads 108 of the stepped structure. The capping dielectric layer 115 may include a dielectric material having an etch selectivity with respect to the plate sacrificial patterns 107. For example, when the plate sacrificial patterns 107 are formed of nitride, the capping dielectric layer 115 may be formed of oxide.

The capping dielectric layer 115 may be deposited by a Chemical Vapor Deposition (CVD) process. To minimize a step height due to the pads 108 of the stepped structure 108, a top surface of the capping dielectric layer 115 may be planarized. According to an embodiment of the inventive concept, as disclosed in FIGS. 2B and 2C, the planarized top surface of the capping dielectric layer 115 may be higher than the uppermost surface of the plate stack structure 110. Therefore, the capping dielectric layer 115 may cover the uppermost surface (for example, a top surface of the uppermost plate insulation pattern) of the plate stack structure 110. However, the inventive concept is not limited thereto. The capping dielectric layer 115 may be planarized until the uppermost surface of the plate stack structure 110 is exposed. Even in this case, the capping dielectric layer 115 may cover the pads 108. In the following description, for convenience, it is assumed that the capping dielectric layer 115 covers the uppermost surface of the plate stack structure 110.

Figure 3B:
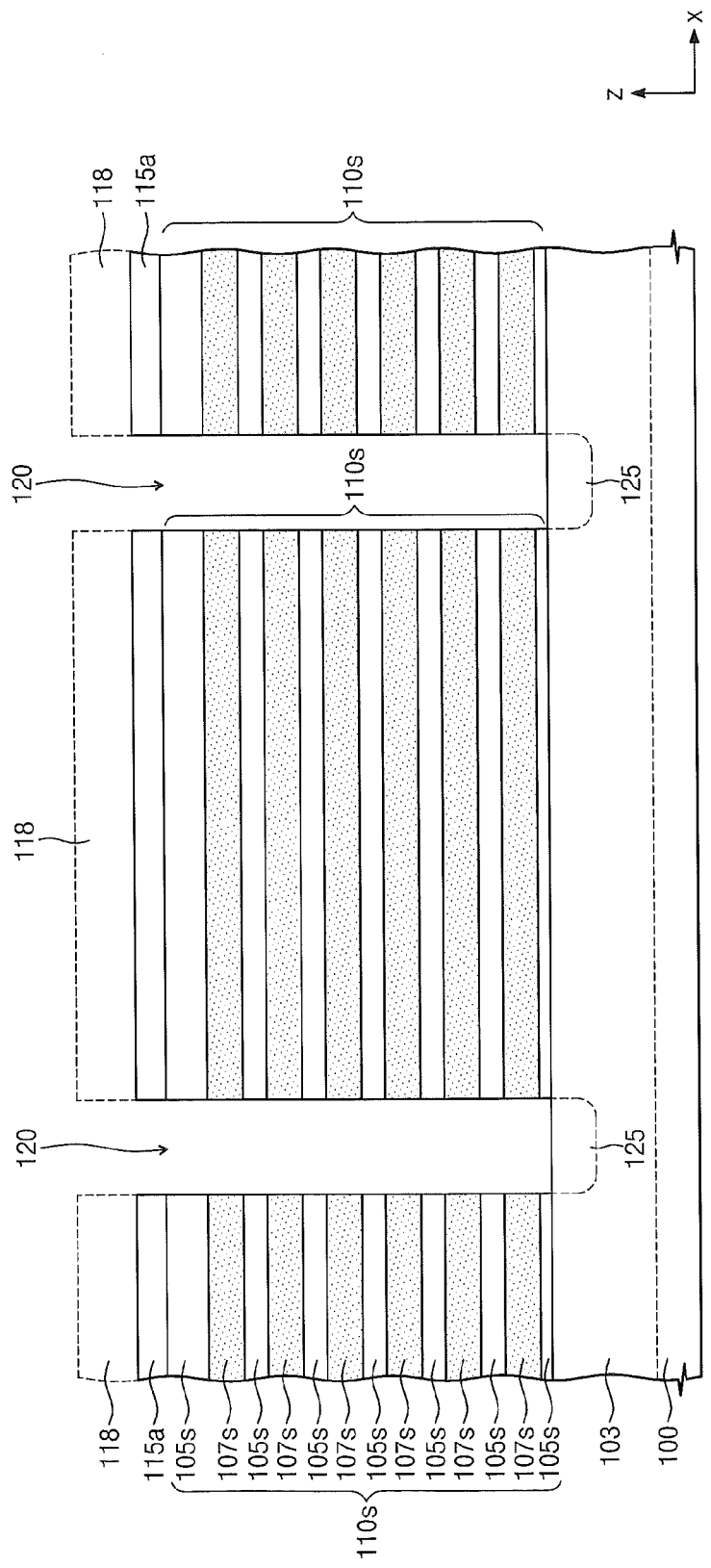
Figure 3C:
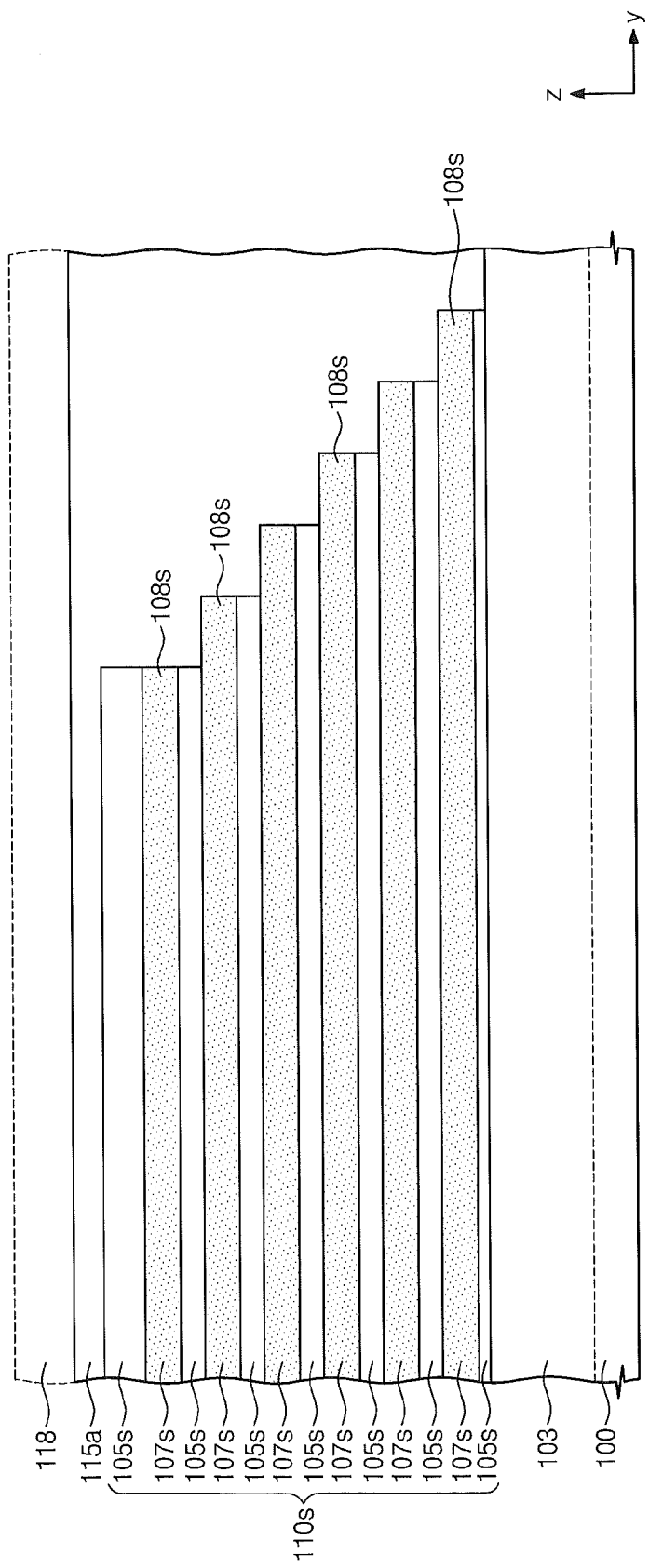

Referring to FIGS. 3A to 3C, at least one first trench 120 is formed to divide the plate stack structure 110 into a plurality of sub-plate stack structures 110s by patterning the plate stack structure 110 and the capping dielectric layer 115.

According to FIGS. 3B and 3C, a first mask pattern 118 (which is illustrated as a dotted line) having a first opening may be formed on the plate stack structure 110 and the capping dielectric layer 115. The first opening may define the first trench 120. The stacked plate insulation patterns 105 and the plate sacrificial patterns 107 may be sequentially etched using the first mask pattern 118 as an etch mask, and thus the first trench 120 may be formed. Each of the sub-plate stack structures 110s may include the sub-plate insulation patterns 105s and the sub-plate sacrificial patterns 107s that are stacked alternately and repeatedly. According to FIG. 3A, the first trench 120 may be extended in the first direction and cross the pads 108 of the plate stack structure 110. Therefore, the first trench 120 divides the pads 108 of the plate stack structure 110. As a result, according to FIGS. 3A and 3C, each of the sub-plate stack structures 110s may have sub-pads 108s constituting a stepped structure. The sub-pads 108s of the respective sub-plate stack structures 110s may correspond to the respective edges of sub-plate sacrificial patterns 107s in the respective sub-plate stack structures 110s. The sub-pads 108s may be covered by the capping dielectric pattern 115a that is formed by the first trench 120.

In some embodiments of the inventive concept, a first doped-region 125 may be formed in a well region 103 under the first trench 120. In some embodiments of the inventive concept, the first doped-region 125 may be doped with a dopant having the same type as that of the well region 103, i.e., the first conductive dopant. A first conductive dopant concentration in the first doped-region 125 may be higher than a first conductive dopant concentration of the well region 103. In this case, a stable well voltage may be supplied to the well region 103 through the first doped-region 125. However, the inventive concept is not limited thereto.

In some embodiments of the inventive concept, the first doped-region 125 may be doped with a second conductive dopant. One of the first and second conductive dopants is an n-type dopant, and the other is a p-type dopant. Therefore, the first doped-region 125 and the well region 103 may form a PN junction. According to still another embodiment of the inventive concept, the first doped-region 125 may not be formed.

Figure 4A:
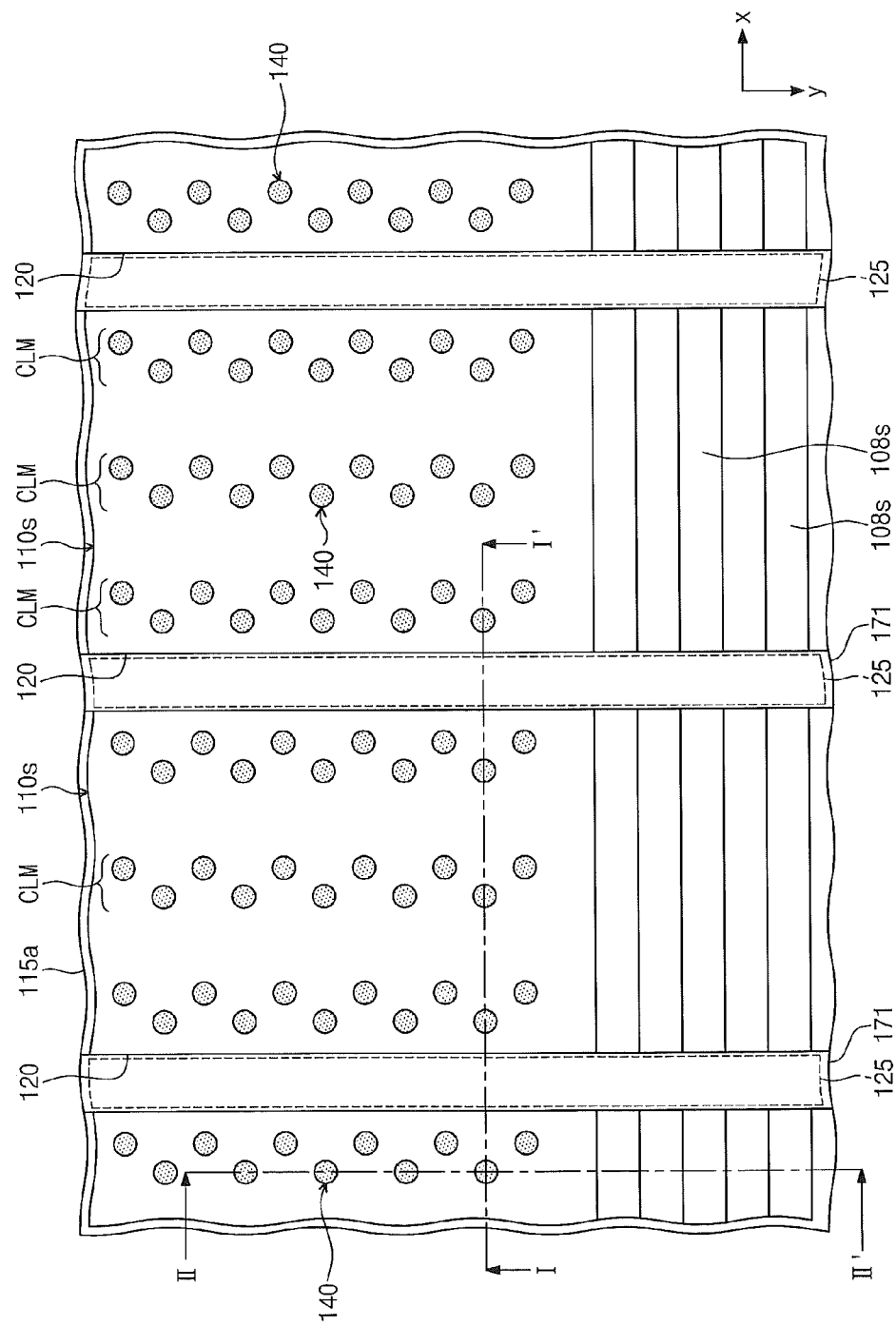
Figure 4B:
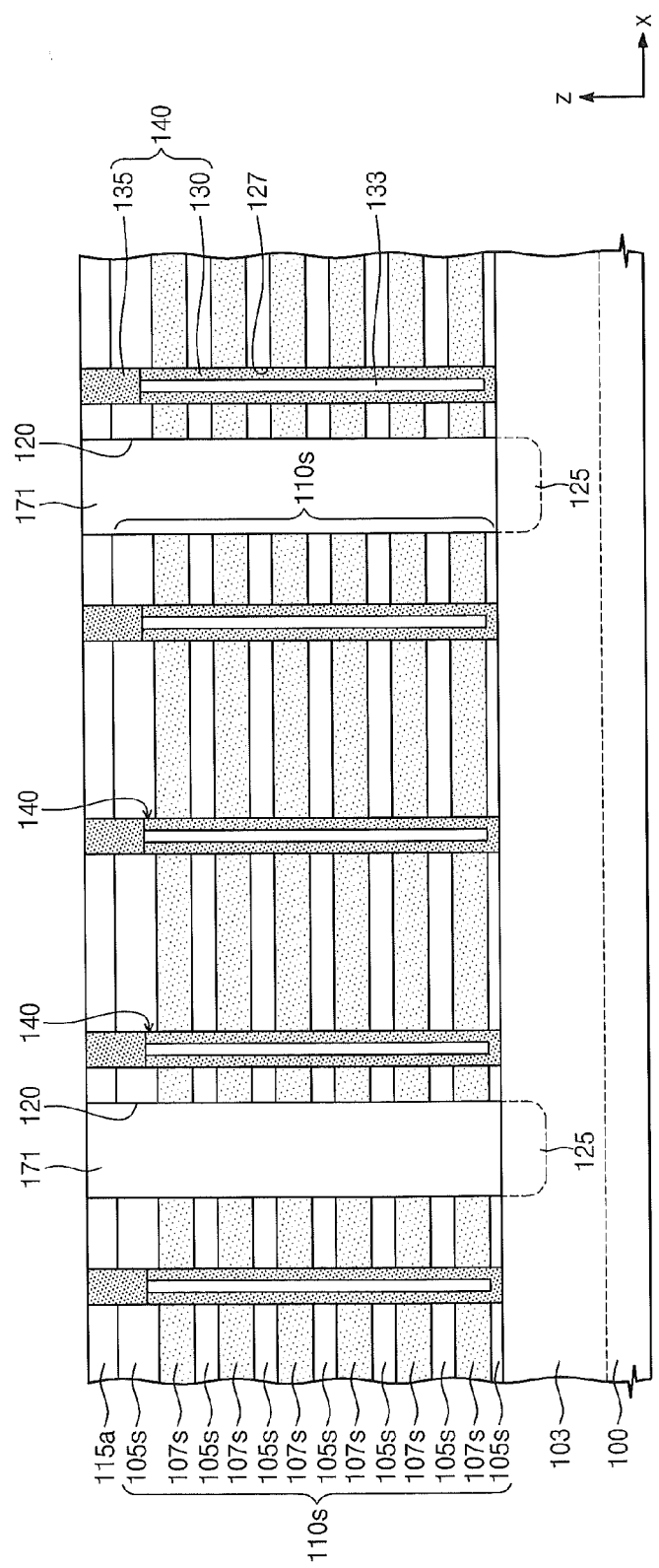

Referring to FIGS. 4A to 4C, a first isolation pattern 171 filling the first trench 120 may be formed. For example, a first isolation layer filling the first trench 120 may be formed on the substrate 100 and then the first isolation layer may be planarized, thereby forming the first isolation pattern 171. The first isolation pattern 171 may include oxide.

A plurality of vertical active patterns 140 passing though each of the sub-plate stack structures 110s may be formed. For example, a plurality of channel holes 127 may be formed, which pass through the capping dielectric pattern 115a on each of the sub-plate stack structures 110s and each of the sub-plate stack structures 110s. A semiconductor layer may be conformally formed on the substrate 100 having the channel holes 127, and a filling dielectric layer may fill the channel holes 127. The filling dielectric layer and the semiconductor layer may be planarized to form the vertical semiconductor pattern 130 and a filling dielectric pattern 133 in the respective channel holes 127. The upper ends of the vertical semiconductor pattern 130 and filling dielectric pattern 133 may be recessed lower than an upper end of the channel hole 127. A capping semiconductor layer filling the channel hole 127 on the vertical semiconductor pattern 130 may be formed on the substrate 100. A capping semiconductor pattern 135 may be formed by planarizing the capping semiconductor layer. The capping semiconductor pattern 135 may be confined to the channel hole 127. The vertical semiconductor pattern 130 and the capping semiconductor pattern 135 in the respective channel holes 127 may constitute the vertical active pattern 140. A drain region may be formed by providing the second conductive dopant to an upper portion of the vertical active pattern 140.

The vertical semiconductor pattern 130 and the capping semiconductor pattern 135 may include the same semiconductor element as that of the substrate 100. For example, when the substrate 100 is a silicon substrate, the vertical semiconductor pattern 130 and the capping semiconductor pattern 135 may include silicon. The vertical semiconductor pattern 130 and the capping semiconductor pattern 135 may be in a crystalline state.

According to FIG. 4A, a plurality of vertical active patterns 140 passing through the respective sub-plate stack structures 110s may be divided into a plurality of column groups CLM. The vertical active patterns 140 in the respective column groups CLM may be arranged in the first direction. In some embodiments of the inventive concept, odd-numbered vertical active patterns of the vertical active patterns 140 in the respective column groups CLM may be offset in the second direction relative to even-numbered vertical active patterns of the vertical active patterns 140 in the respective column groups CLM. Accordingly, the vertical active patterns 140 in the respective column groups CLM may be arranged in a zigzag shape along the first direction.

According to the above-described manufacture method, after a plate stack structure 110 having the pads 108 are divided into a plurality of sub-plate stack structures 110s, the vertical active patterns 140 passing through the respective sub-plate stack structures 110s may be formed. Accordingly, stress that the sub-plate stack structures 110s apply to the vertical active patterns 140 can be minimized.

The plate sacrificial patterns 107 may be formed of a material different from that of the plate insulation patterns 105. Therefore, stress may occur due to the plate sacrificial patterns 107. For example, when the plate sacrificial patterns 107 are formed of nitride, the plate sacrificial patterns 107 may generate stress in a direction parallel to a top surface of the substrate 100. Particularly, due to the pads 108 of the stepped structure, a plate sacrificial pattern disposed at a relatively high level among the stacked plate sacrificial patterns 107 may generate more stress than a plate sacrificial pattern disposed at a relatively low level. The plate sacrificial pattern disposed at a relatively high level is referred to as a high-level plate sacrificial pattern, and the plate sacrificial pattern disposed at a relatively lower level is referred to as a low-level plate sacrificial pattern. This may be because a contact area between the high-level plate sacrificial pattern and a plate insulation pattern 105 adjacent thereto is smaller than a contacting area between the low-level plate sacrificial pattern and a plate insulation pattern 105 adjacent thereto. The plate insulation pattern 105 may moderate the stress of the plate sacrificial pattern 107. Accordingly, the high-level plate sacrificial pattern having a small contacting area may provide more stress than the low-level plate sacrificial pattern having a large contacting area. If the vertical active patterns 140 are formed in the plate stack structure having the pads 108, at least one portion of the vertical active patterns 140 may be inclined due to the stress of the high-level plate sacrificial pattern.

However, according to an embodiment of the inventive concept, as described above, after the plate stack structure 110 having the pads 108 is divided into the sub-plate stack structures 110s, the vertical active pattern 140 may be formed in each of the sub-plate stack structures 110s. Therefore, by reducing the stress, pattern failures of the vertical active patterns 140 can be reduced. As a result, a highly reliable and/or highly integrated 3D semiconductor memory device can be realized.

Figure 5B:
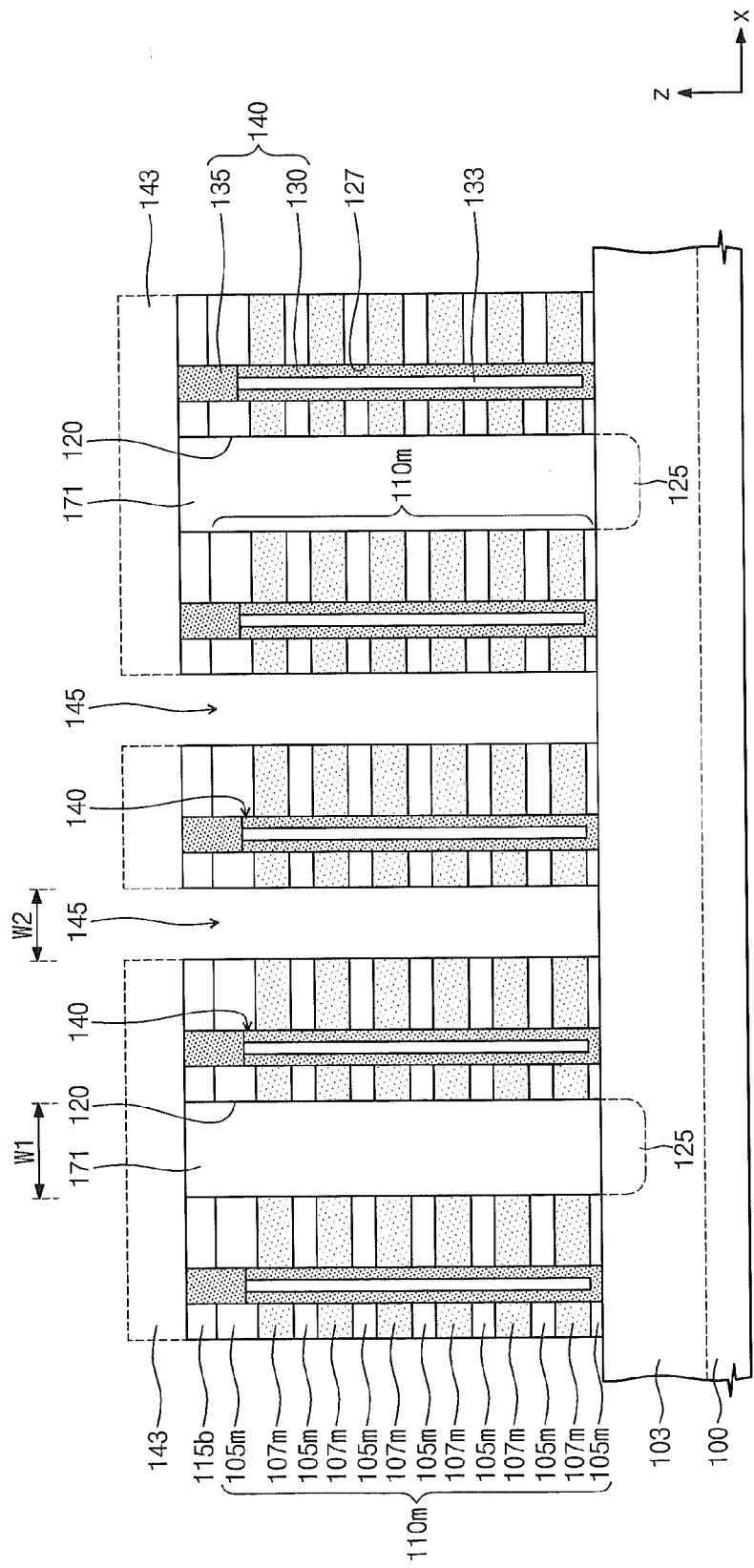
Figure 5C:
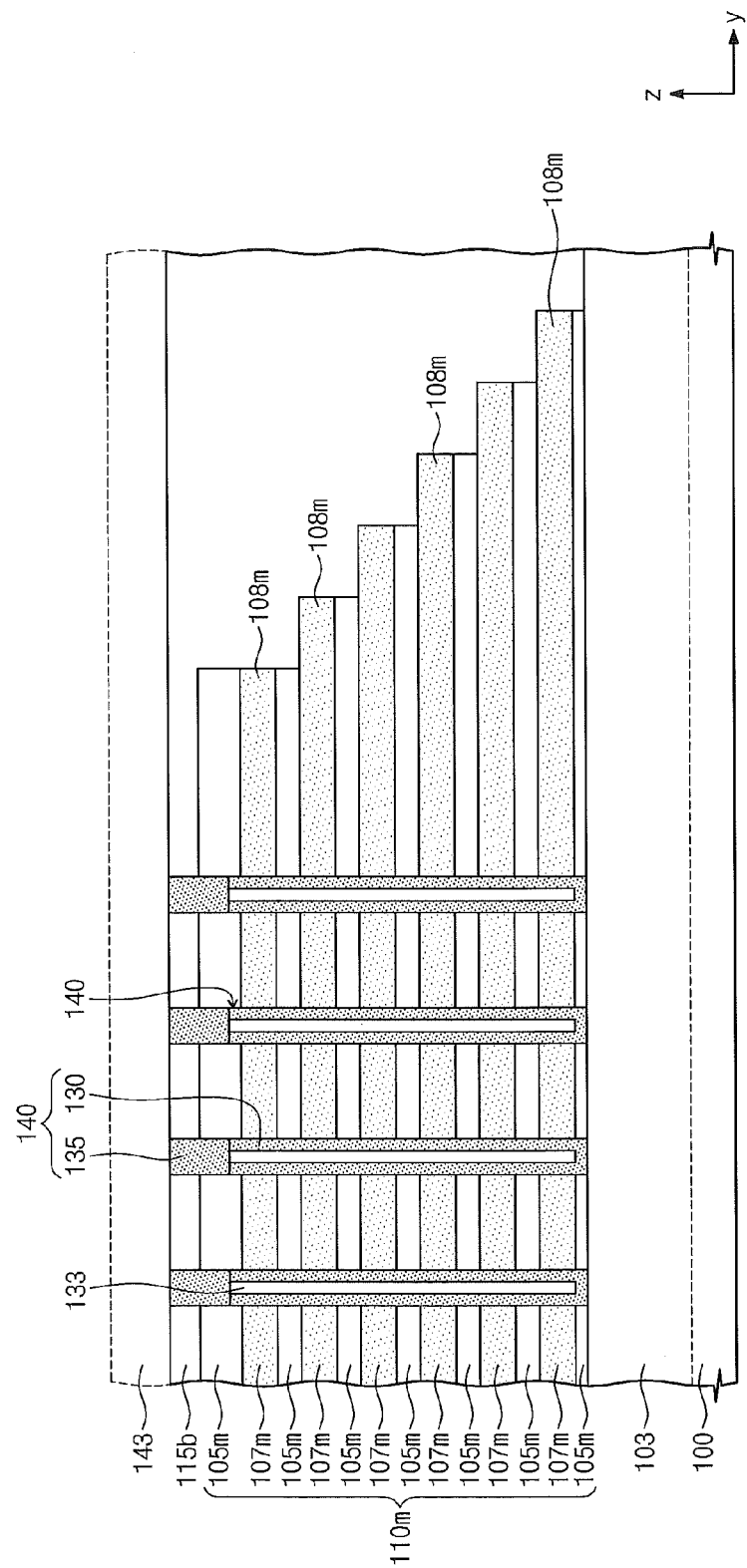

Referring to FIGS. 5A to 5C, at least one second trench 145, which divides each of the sub-plate stack structure 110s having the vertical active patterns 140 into a plurality of mold-stack structures 110m, may be formed. According to FIGS. 5A and 5C, a second mask pattern 143 having at least one second opening may be formed on the substrate 100 having the vertical active patterns 140. The second opening may define the location of the second trench 145. The second mask pattern 143 covers the vertical active patterns 140. Also, the second mask pattern 143 may cover the first isolation pattern 171. The capping insulation patterns 115a and the sub-plate stack structure 110s may be sequentially etched using the second mask pattern 143 as an etch mask, and thus the second trench 145 may be formed. The mold-stack structures 110m may be formed by formation of the second trench 145. Moreover, a mold capping dielectric pattern 115b may be formed on each of the mold-structures 110m. The mold capping dielectric pattern 115b corresponds to a portion of the capping dielectric pattern 115a.

The mold-stack structures 110m may include a plurality of mold insulation patterns 105m and a plurality of mold sacrificial patterns 107m that are stacked alternately and repeatedly. According to FIGS. 5A and 5C, the mold sacrificial patterns 107m have mold-pads 108m providing a stepped structure. The mold-pads 108m may correspond to edges of the mold sacrificial patterns 107m being stacked, respectively. In a plan view, as disclosed in FIG. 5A, the second trench 145 may extend in parallel to the first trench 120 and cross the sub-pads 108s. Therefore, the mold-pads 108m of the stepped structure may be divided from the sub-pads 108s of the stepped structure. The mold-pads 108m are covered by the mold capping dielectric pattern 115b.

The first trench 120 has a first width W1 in the second direction, and the second trench 145 has a second width W2 in the second direction. In some embodiments of the inventive concept, the first width W1 of the first trench 120 may differ from the second width W2 of the second trench 145. The first width W1 of the first trench 120 may be greater than the second width W2 of the second trench 145. However, the inventive concept is not limited thereto. The first width W1 of the first trench 120 may be less than the second width W2 of the second trench 145. In some embodiments according to the inventive concept, the first width W1 of the first trench 120 may be the substantially same as the second width W2 of the second trench 145.

The vertical active patterns 140 in each of the column groups CLM may pass through each of the mold-stack structures 110m. In other words, the second trench 145 may be formed between a pair of adjacent column groups CLM in the each sub-plate stack structure 110s. After formation of the second trench 145, the second mask pattern 143 may be removed.

Referring to FIGS. 6A to 6C, a second doped-region 150 may be formed in a well region 103 under the second trench 145. The doped-region 150 may be doped with the second conductive dopant. The second doped-region 150 may correspond to a common source region. the second doped-region 150 may be formed after removing the second mask pattern 143. In some embodiments according to the inventive concept, the second doped-region 150 may be formed after the second trench 145 is formed and before the second mask pattern 143 is removed.

A plurality of gap regions 155 may be formed by removing the mold sacrificial patterns 107m of the mold-stack structure 110m. A mold-stack structure 110m' having the gap regions 155 may be supported by the vertical active patterns 140. In some embodiments according to the inventive concept, after forming the gap regions 155, the first isolation pattern 171 may remain.

Figure 7A:
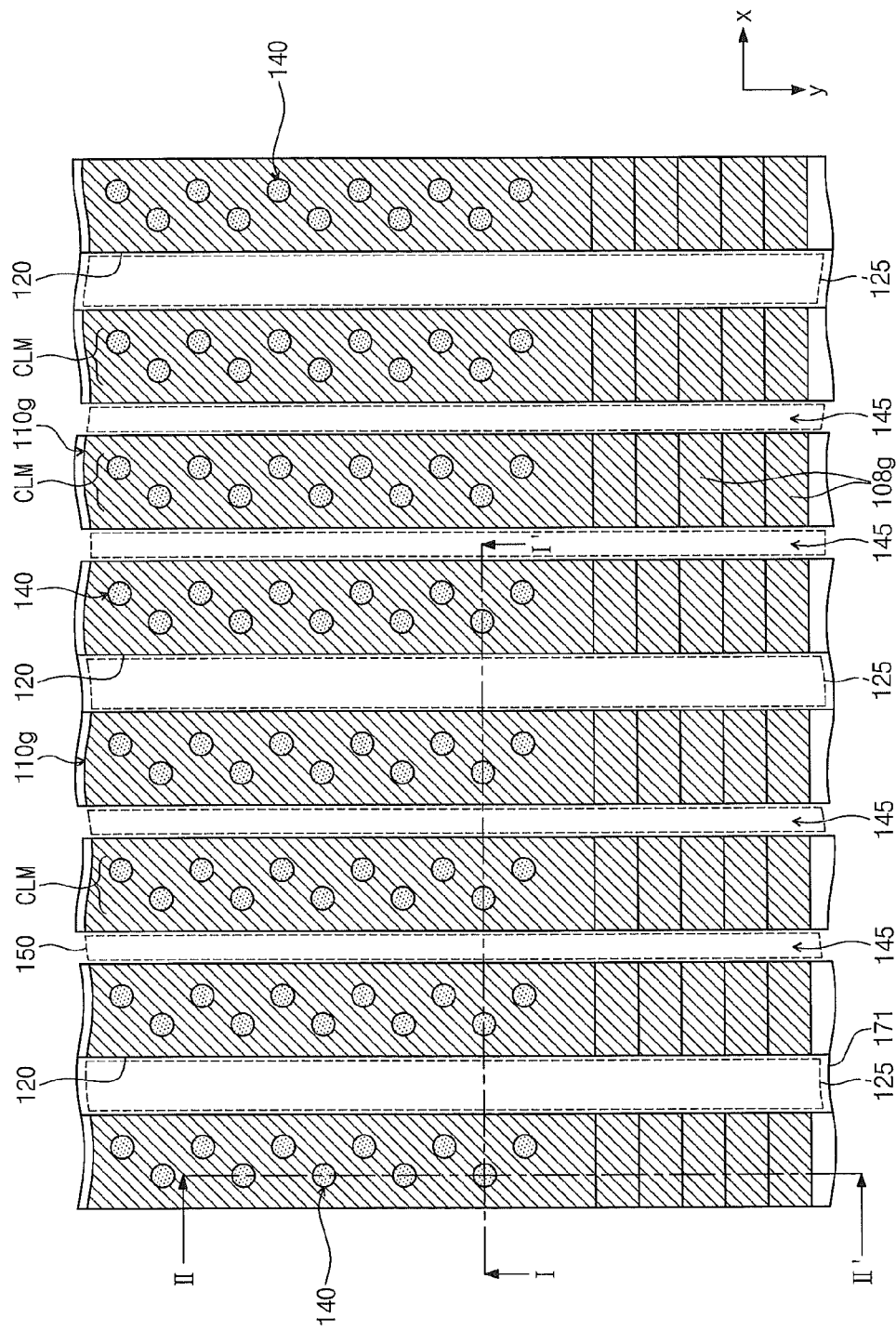
Figure 7B:
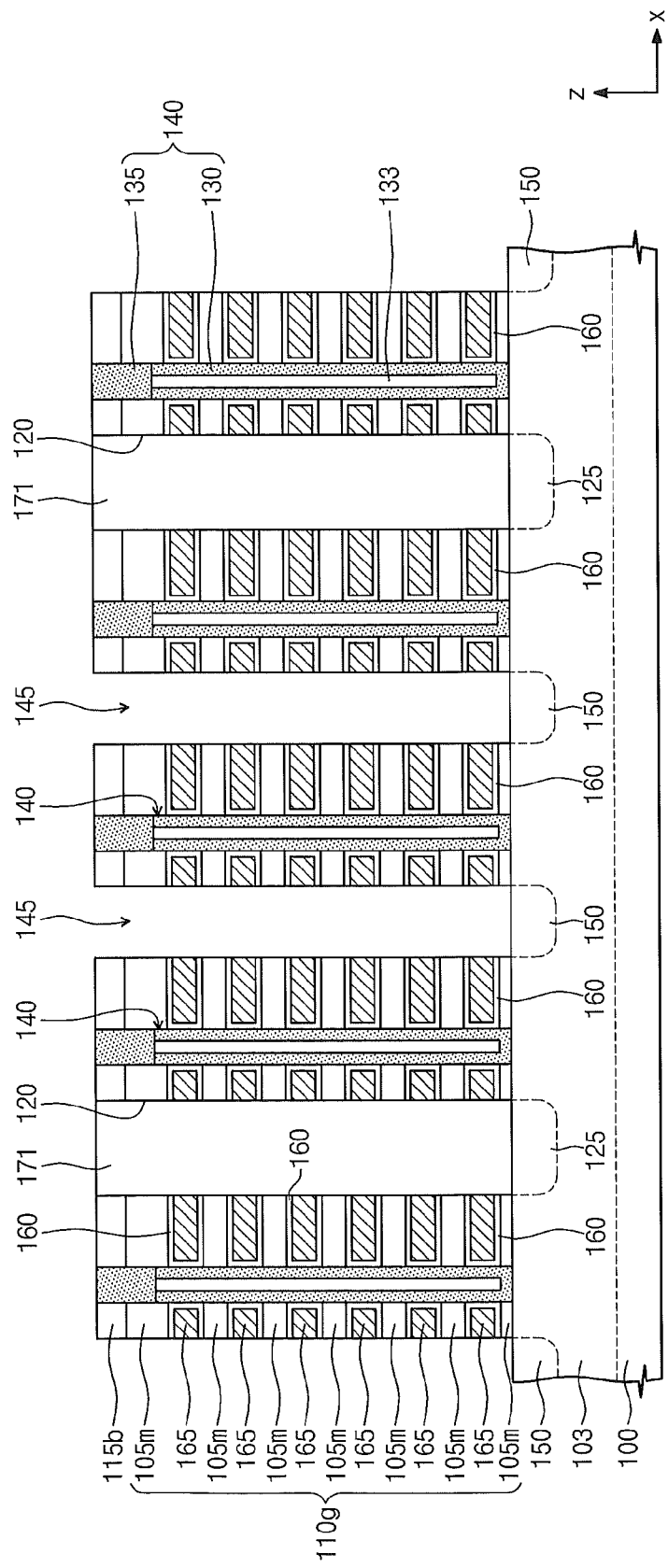
Figure 7C:
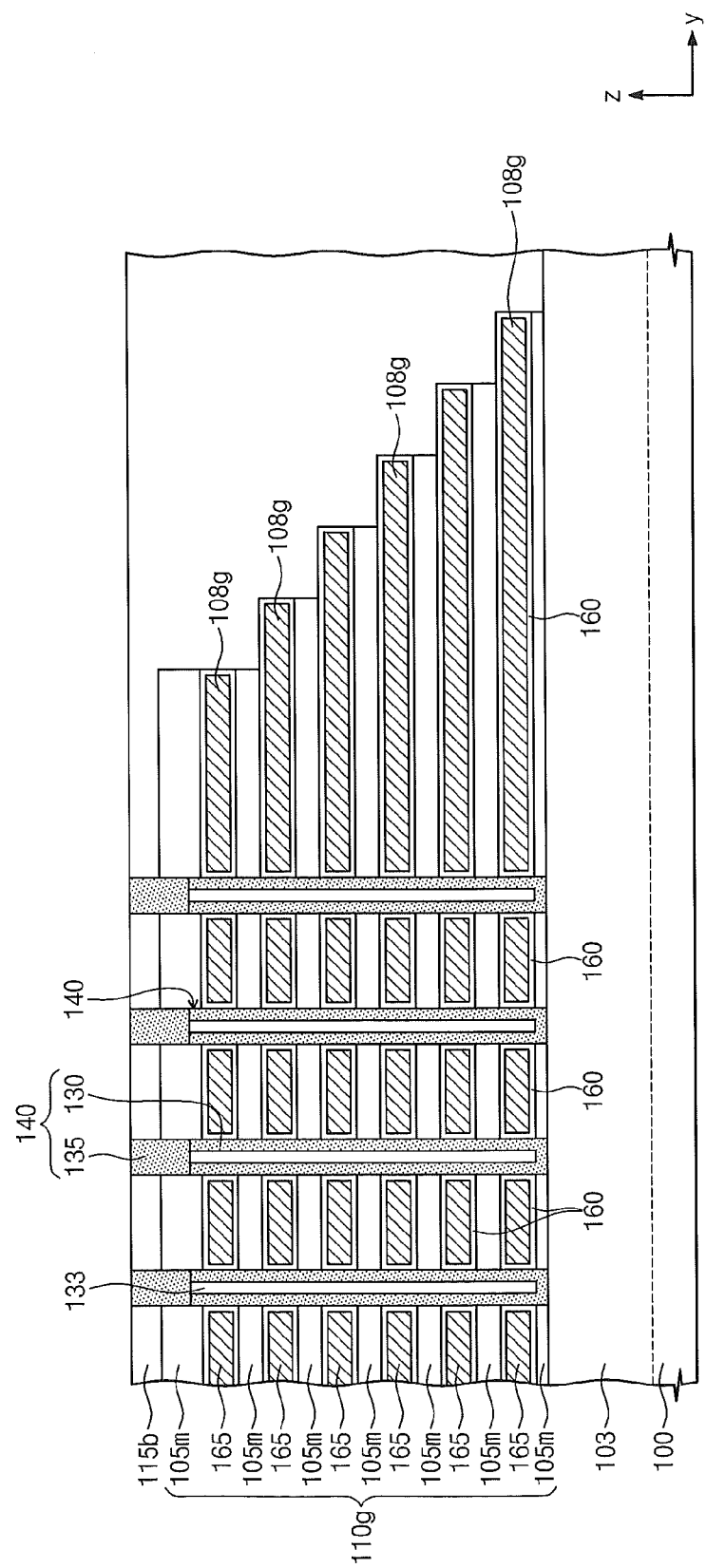

Referring to FIGS. 7A to 7C, a plurality of gate patterns 165 may be formed in the gap regions 155, respectively. A multi-layered dielectric layer 160 may be formed between a sidewall of the respective gate patterns 165 and a sidewall of the respective vertical active patterns 140. For example, the multi-layered dielectric layer 160 may be conformally formed on a substrate 100 having the gap regions 155, before formation of the gate patterns 165. The multi-layered dielectric layer 160 may be conformally formed on inner surfaces of the gap regions 155. A gate conductive layer filling the gap regions 155 may be formed on a substrate 100 having the multi-layered dielectric layer 160. Subsequently, the gate patterns 165 respectively disposed in the gap regions 155 may be formed by removing the gate conductive layer outside the gap regions 155. Thus, the multi-layered dielectric layer 160 may cover a bottom surface and top surface of the respective gate patterns 165.

The multi-layered dielectric layer 160 may include a tunnel dielectric layer, a charge storage layer, and a blocking dielectric layer. The tunnel dielectric layer may be adjacent to the sidewall of the vertical active pattern 140, and the blocking dielectric layer may be adjacent to the gate pattern 165. The charge storage layer may be disposed between the tunnel dielectric layer and the blocking dielectric layer. The tunnel dielectric layer may include oxide and/or oxynitride. The charge storage layer may include a trap dielectric material having traps for storing an electric charge. For example, the charge storage layer may include nitride. The blocking dielectric layer may include a high dielectric material (for example, metal oxide such as hafnium oxide and/or aluminum oxide, etc) that has a dielectric constant higher than that of the tunnel dielectric layer. Furthermore, the blocking dielectric layer may further include a barrier dielectric material (for example, oxide) having an energy band gap that is greater than that of the high dielectric material.

The mold insulation patterns 105m and the gate patterns 165 that are alternately and repeatedly stacked may provide the gate stack structure 110g. Due to the mold-pads 108m of the mold sacrificial patterns 107m, the gate patterns 165 of the gate stack structure 110g may include conductive pads 108g constituting a stepped structure, respectively.

An uppermost gate pattern in the gate stack structure 110g may correspond to a string selection gate, and a lowermost gate pattern in the gate stack structure 110g may correspond to a ground selection gate. Also, the gate patterns 165 in the gate stack structure 110g may include a plurality of cell gates.

The cell gates may be disposed between the ground selection gate and the string selection gate. The gate patterns 165 are formed of a conductive material. For example, the gate patterns 165 may include at least one of a doped semiconductor (for example, doped silicon, etc.), metal (for example, tungsten (W), aluminum (Al), copper (Cu), etc.), conductive metal nitride (for example, titanium nitride, tantalum nitride, tungsten nitride, etc.), and transition metal (for example, titanium (Ti), tantalum (Ta), etc.).

Figure 8B:
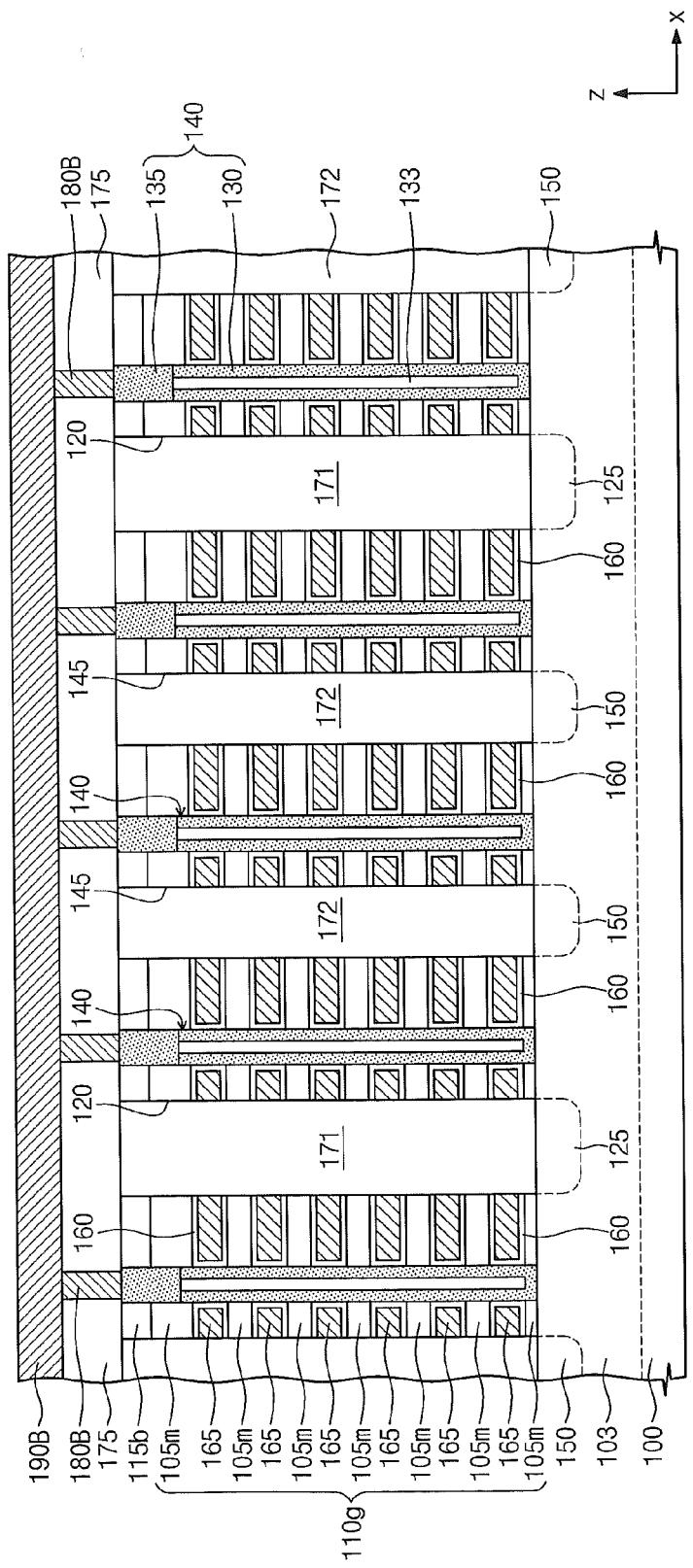
Figure 8C:
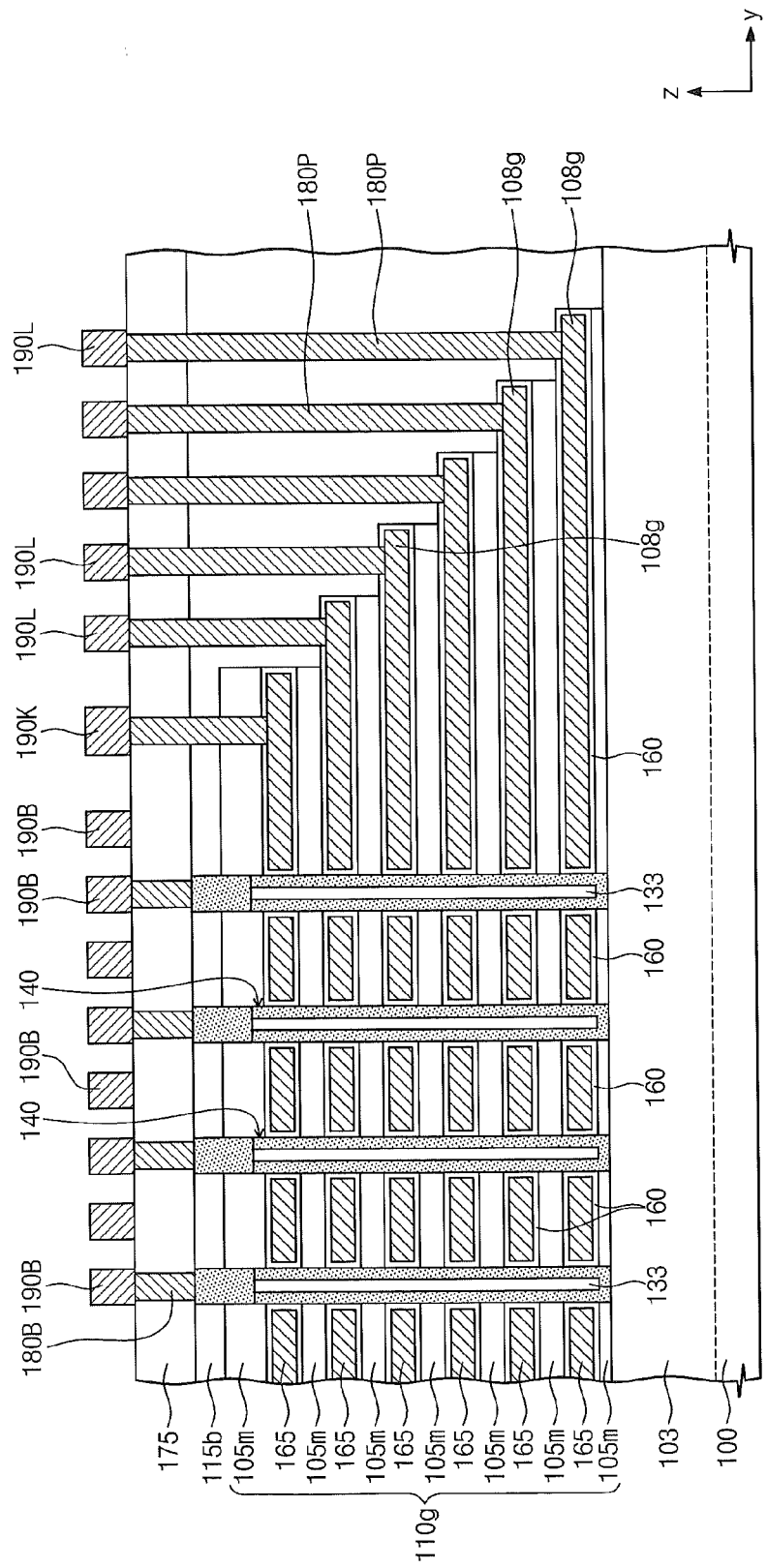

Referring to FIGS. 8A to 8C, after formation of the gate patterns 165, a second isolation pattern 172 filling the second trench 145 may be formed. The second isolation pattern 172 may include oxide.

An interlayer dielectric 175 may be formed over the substrate 100. A plurality of first contact plugs 180B, which are respectively connected to the vertical active patterns 140 through the interlayer dielectric 175, may be formed. A plurality of second contact plugs 180P, which are respectively connected to the conductive pads 108g through the mold capping dielectric pattern 115b, may be formed. According to an embodiment of the inventive concept, the first contact plugs 180B and the second contact plugs 180P may be formed at the same time. In some embodiments according to the inventive concept, the first contact plugs 180B and the second contact plugs 180P may be sequentially formed irrespective of order.

A plurality of bit lines 190B may be formed on the interlayer dielectric 175. The bit line 190B may be connected to the first contact plug 180B. According to FIG. 8A, the bit lines 190B may be extended side by side in the second direction. The respective bit lines 190B may be electrically connected to the vertical active patterns 140 that are arranged in the second direction to form one row. The vertical active patterns 140 in the respective column groups CLM may be connected to different bit lines 190B, respectively.

A plurality of local interconnections 190L may be formed on the interlayer dielectric 175. The local interconnections 190L may be connected to the second contact plug 180P. According to FIG. 8A, the local interconnections 190L may extend in parallel with the bit lines 190B. The respective local interconnections 190L may be electrically connected to the conductive pads 108g that are disposed at the same level and are included in a plurality of the gate stack structures 110g. In this case, pads of gate patterns used as a string selection gate are not connected to the local interconnection 190L. Gate patterns used as a string selection gate may be controlled independently from each other. In some embodiments according to the inventive concept, a landing pad 190K may be formed on a second contact plug 180P that is connected to a gate pattern used as the string selection gate.

According to an embodiment of the inventive concept, the bit lines 190B, the local interconnections 190L and the landing pads 190K may be formed at the same time. In some embodiments according to the inventive concept, the bit lines 190B may be formed after the local interconnections 190L are formed or before the local interconnections 190L are formed. According to an embodiment of the inventive concept, the bit lines 190B and the local interconnections 190L may be formed at the same level. In some embodiments according to the inventive concept, the bit lines 190B and the local interconnections 190L may be formed at different levels.

According to the above-described 3D semiconductor memory device, a plate stack structure 110 having the pads 108 may be divided into a plurality of sub-plate stack structures 110s, and thereafter the vertical active patterns 140 may be formed. Therefore, modification of the vertical active patterns 140 can be minimized.

(Second Embodiment)

The same elements as those of the above-described first embodiment of the inventive concept use like reference numerals. To avoid repetitive description, moreover, the same processes as those of the above-described first embodiment of the inventive concept will not be described below.

FIGS. 9A to 13A are a plan views illustrating a method of manufacturing a 3D semiconductor memory device according to another embodiment of the inventive concept. FIGS. 9B to 13B are sectional views taken along line of FIGS. 9A to 13A, respectively. FIGS. 9C to 13C are sectional views taken along line IV-IV' of FIGS. 9A to 13A, respectively.

Figure 9A:
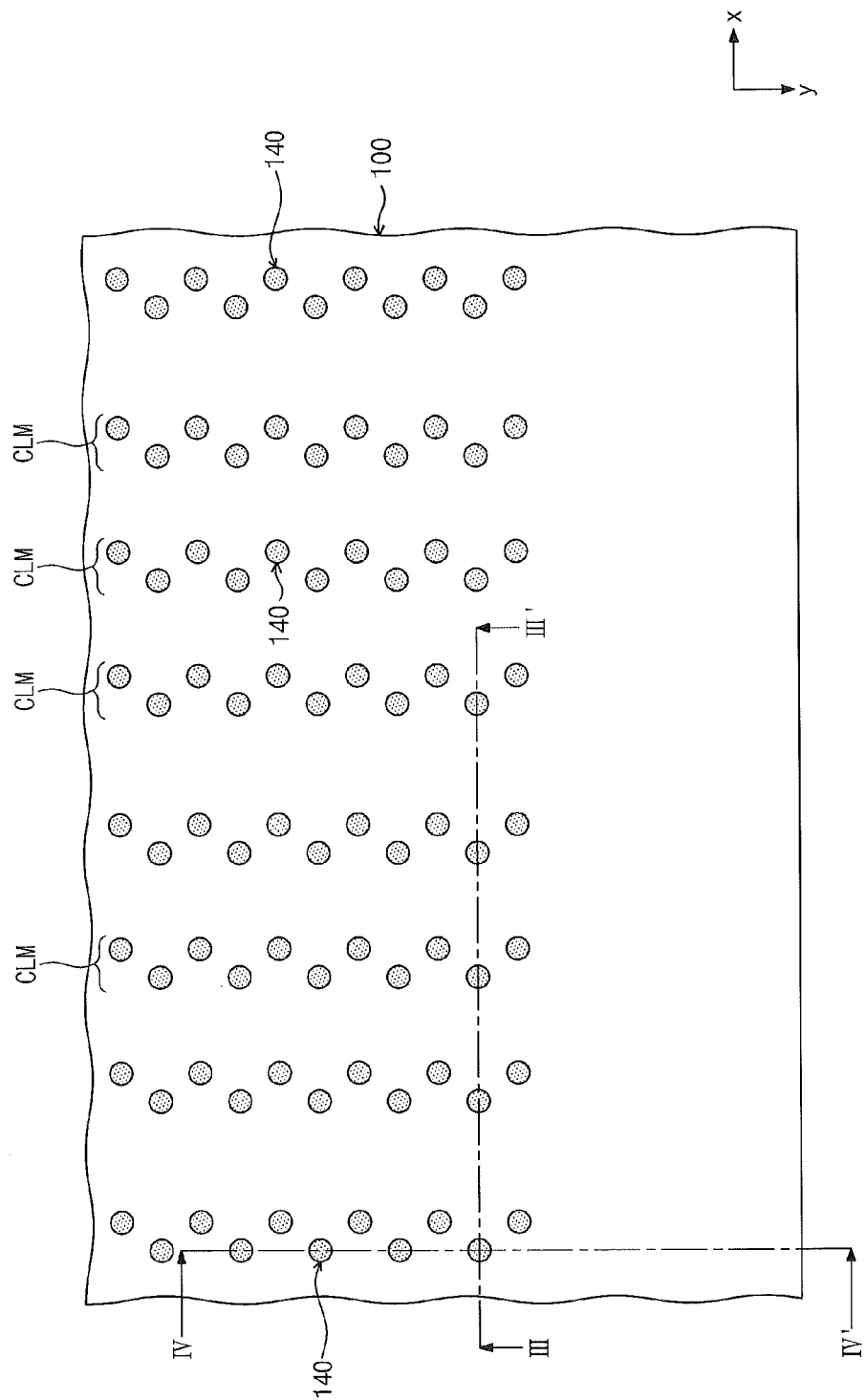
Figure 9B:
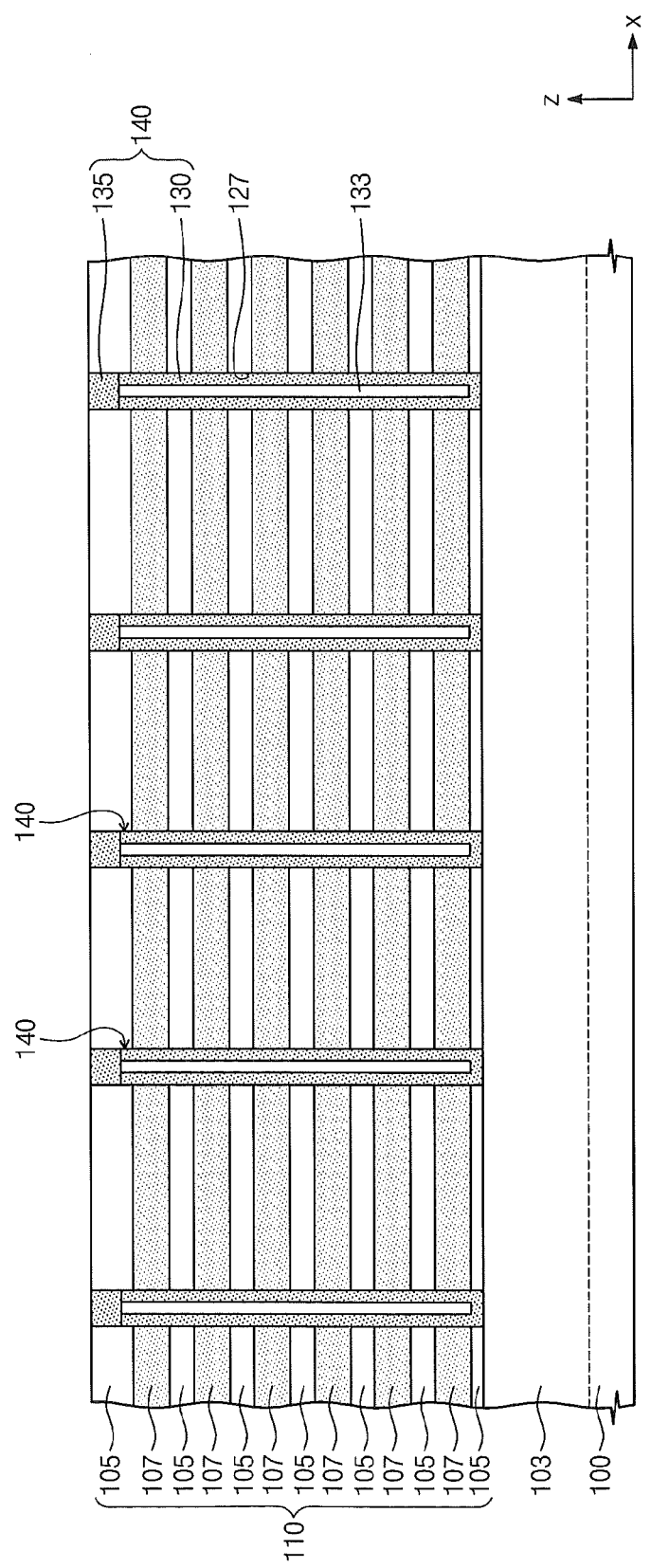
Figure 9C:
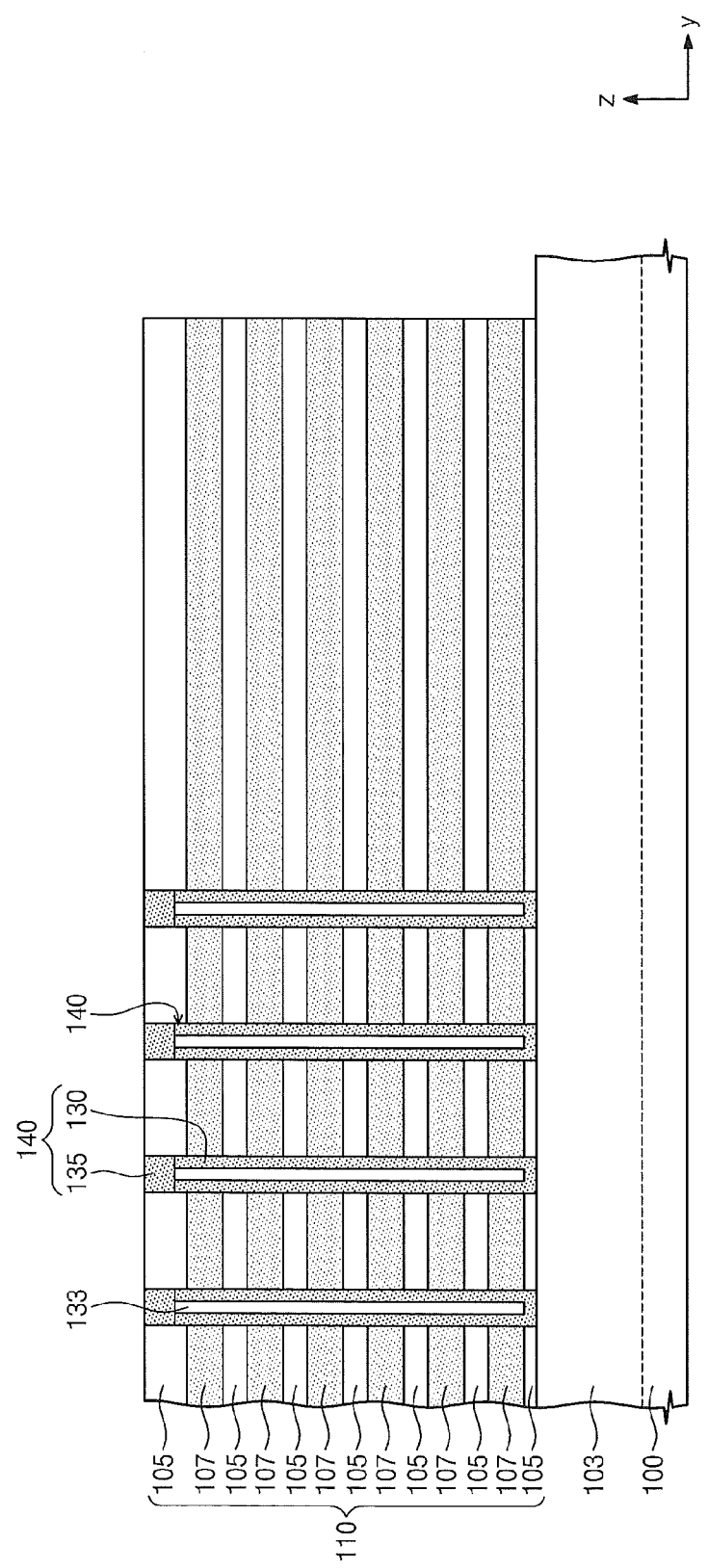

Referring to FIGS. 9A to 9C, a plate stack structure 110 may be formed on a substrate 100 having a well region 103. A plurality of plate insulation patterns 105 and plate sacrificial patterns 107 in the plate stack structure 110 may have self-aligned sidewalls, respectively.

A plurality of vertical active patterns 140 may be formed through the plate stack structure 110. Herein, the plate stack structure 110 having the vertical active patterns 140 may not have pads of a stepped structure. For example, an area of a lowermost plate sacrificial pattern in the plate stack structure 110 having the vertical active patterns 140 may be the substantially same as that of an uppermost plate sacrificial pattern in the plate stack structure 110 having the vertical active patterns 140 when viewed from a plan view.

According to FIG. 9A, the vertical active patterns 140 passing through the plate stack structure 110 may be divided into a plurality of column groups CLM. The vertical active patterns 140 may contact the well region 103.

Figure 10A:
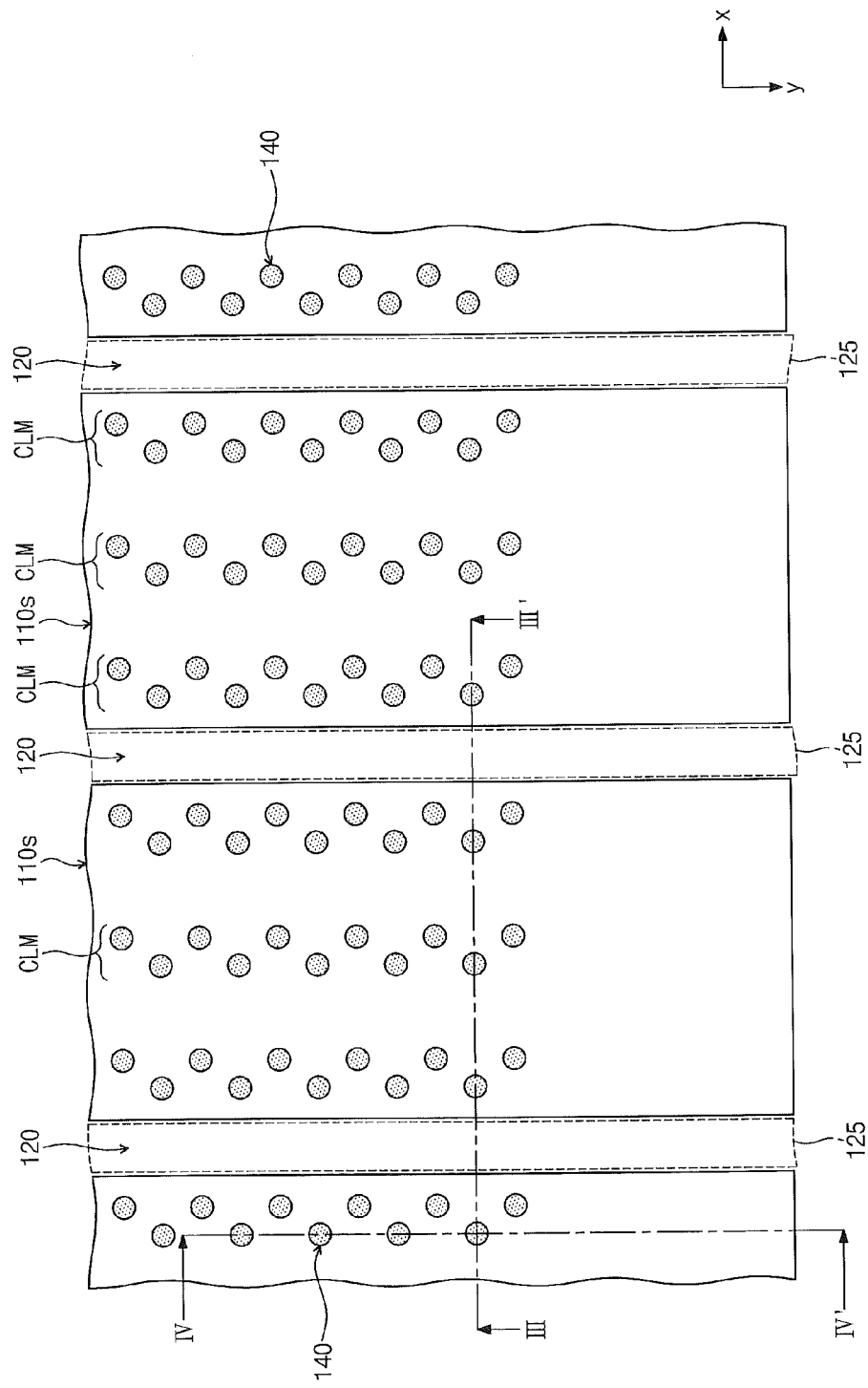
Figure 10B:
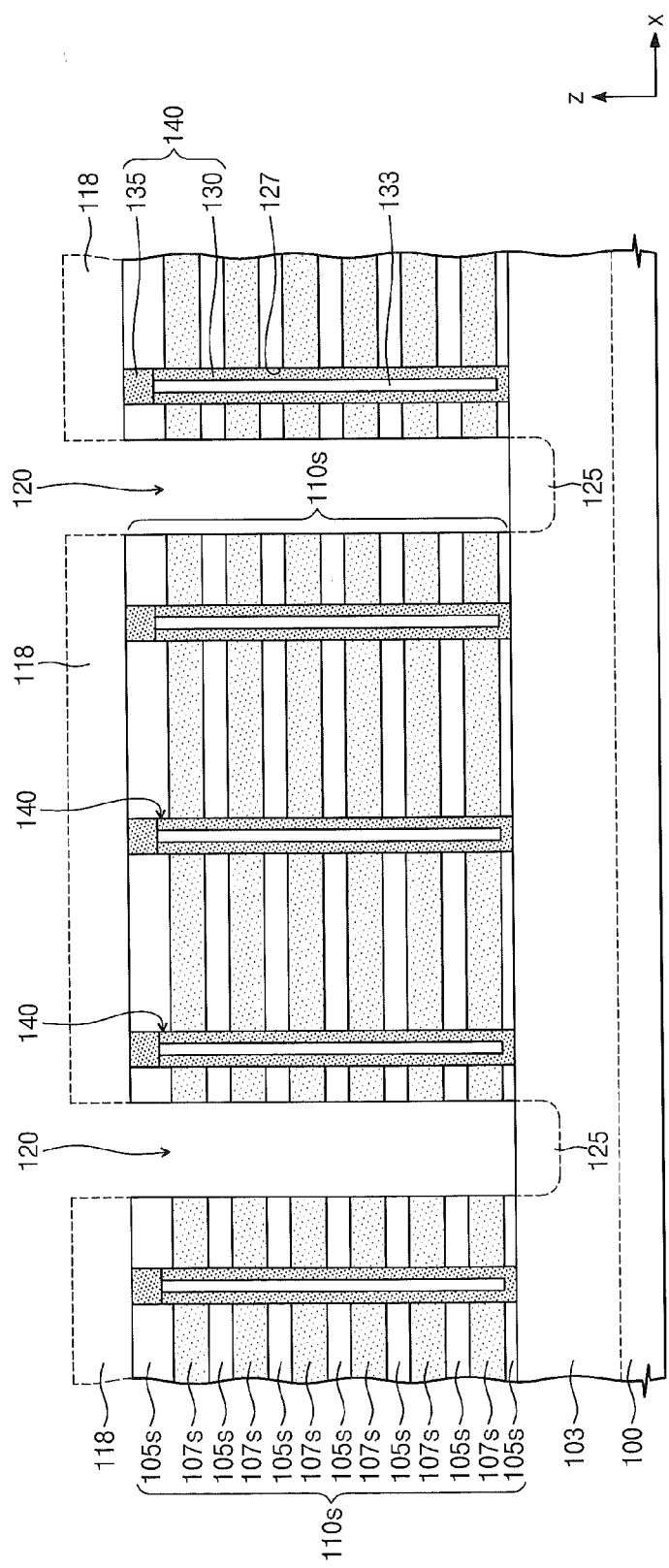
Figure 10C:
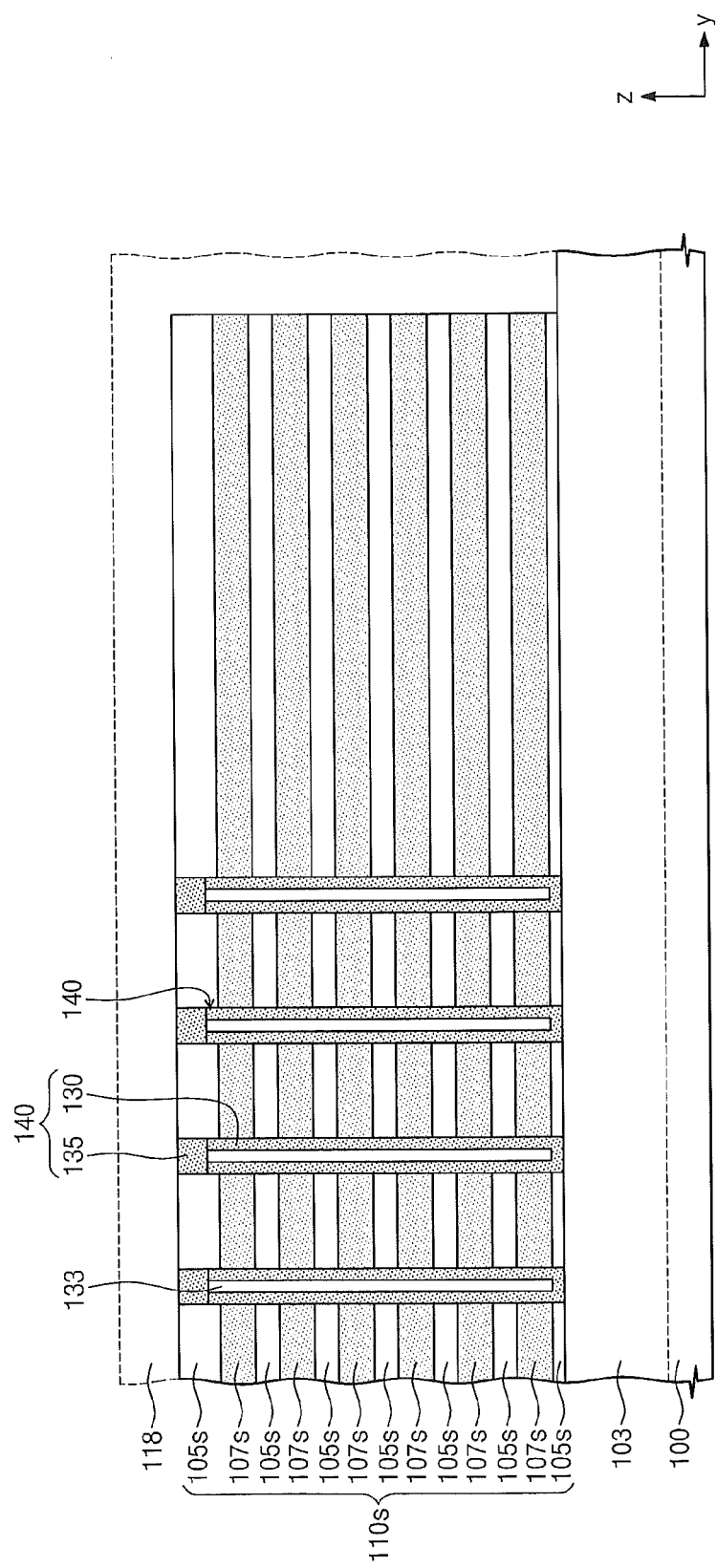

Referring to FIGS. 10A to 10C, a first trench 120 may be formed to divide the plate stack structure 110 having the vertical active patterns 140 into a plurality of sub-plate stack structures 110s. For example, a first mask pattern 118 having a first opening may be formed on the substrate 100 having the plate stack structure 110. The first mask pattern 118 may cover the vertical active patterns 140. The plate insulation patterns 105 and the plate sacrificial patterns 107 in the plate stack structure 110 may be sequentially etched using the first mask pattern 118 as an etch mask, and thus the first trench 120 may be formed. According to FIG. 10A, each of the sub-plate stack structures 110s may include a plurality of the column groups CLM. Each of the sub-plate stack structures 110s may include a plurality of sub-plate insulation patterns 105s and a plurality of sub-plate sacrificial patterns 107s that are stacked alternately and repeatedly.

A first doped-region 125 may be formed in a well region 103 under the first trench 120. The first doped-region 125 may be doped with a dopant having the same type as that of the well region 103, or doped with a dopant having a type different from that of the well region 103. In some embodiments according to the inventive concept, the first doped-region 125 may not be provided. After formation of the first trench 120, the first mask pattern 118 may be removed. The first mask pattern 118 may be removed after or before the first doped-region 125 is formed.

Figure 11A:
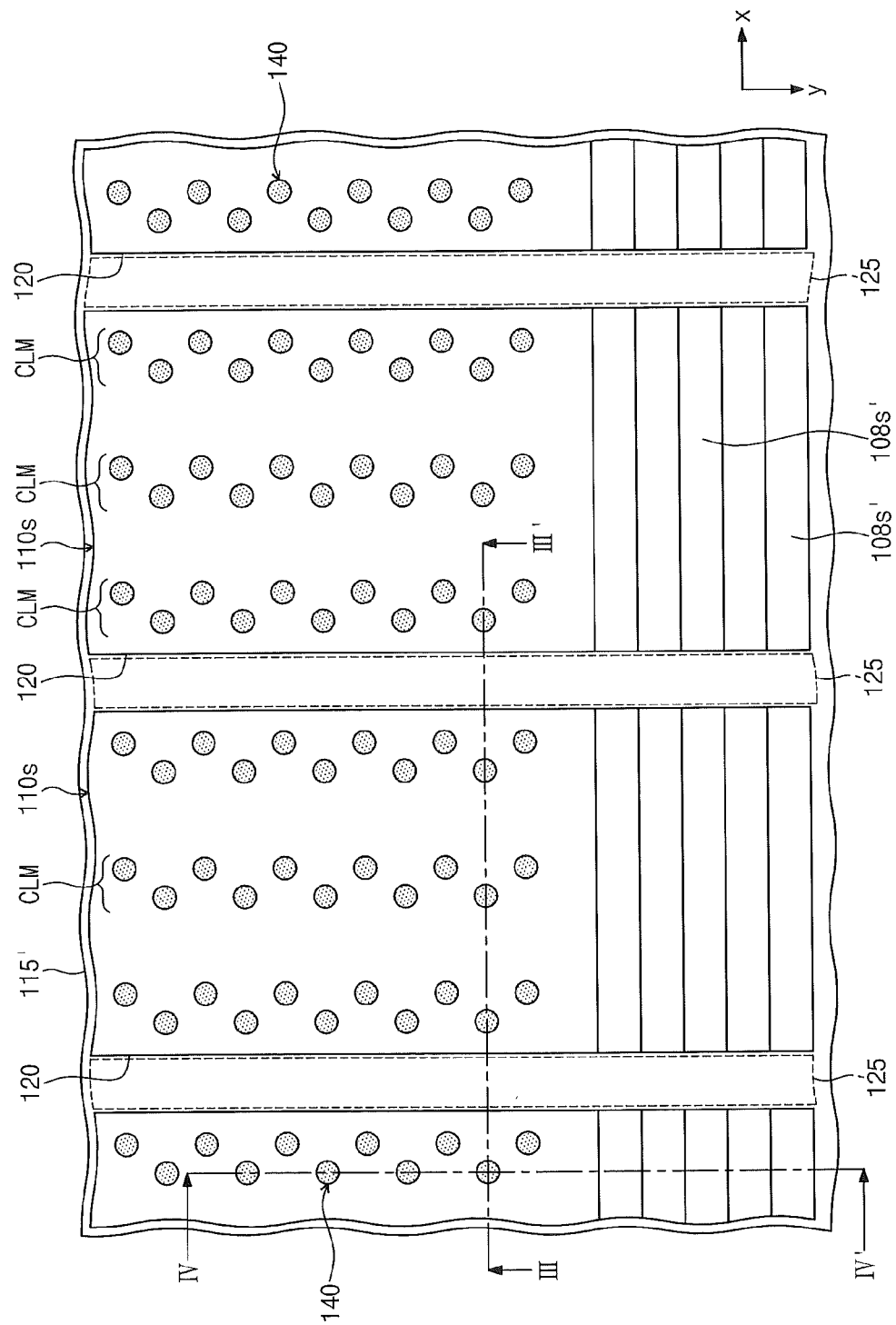
Figure 11B:
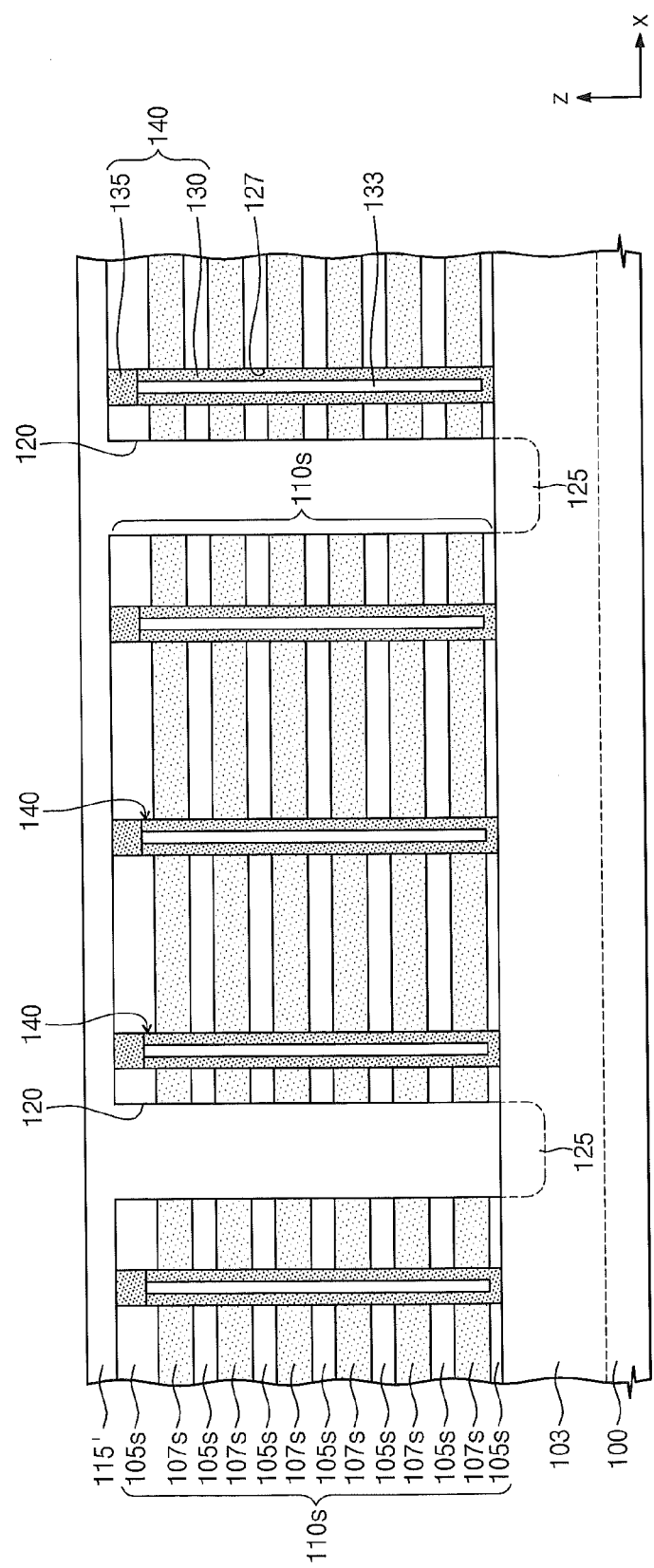
Figure 11C:
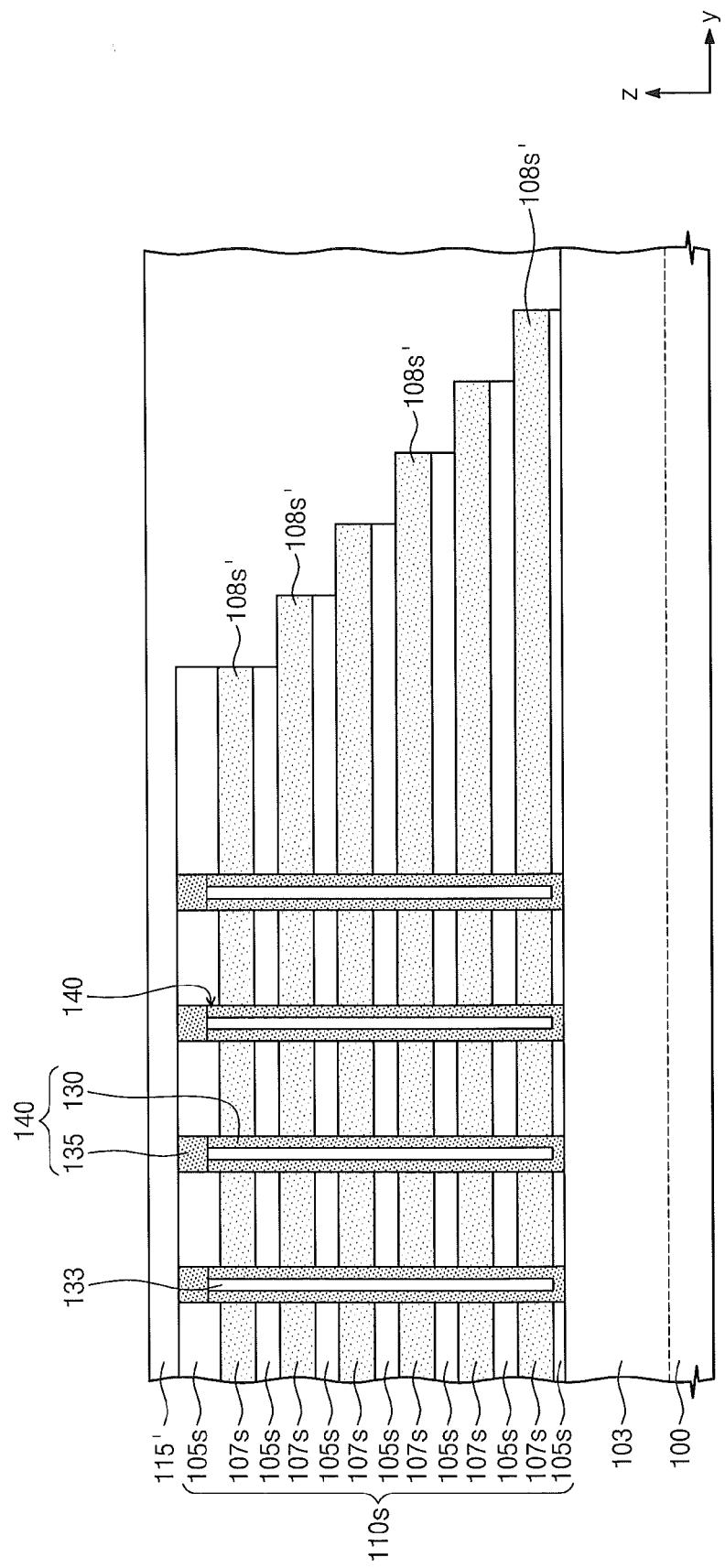

Referring to FIGS. 11A to 11C, pads 108s' constituting a stepped structure may be formed by patterning an edge of the each sub-plate stack structure 110s having the vertical active patterns 140. The pads 108s' may correspond to edges of the sub-plate sacrificial patterns 107s in the sub-plate structure 110s. The pads 108s' of the stepped structure may be formed by performing a patterning process, which includes a plurality of etch processes and a consumptive mask pattern described above in the first embodiment of the inventive concept, for the sub-plate stack structure 110s.

In some embodiments according to the inventive concept, after the plate stack structure 110 having the vertical active patterns 140 are divided into a plurality of sub-plate stack structures 110s, the pads 108s' constituting the stepped structure are formed at an edge of the sub-plate stack structure 110s. That is, by dividing the plate stack structure 110 having the vertical active patterns 140 into a plurality of sub-plate stack patterns 110s, stresses of the sub-plate sacrificial patterns 107s in each of the sub-plate stack structures 110s are moderated. Subsequently, the pads 108s' of the stepped structure are formed in the each sub-plate stack structure 110s having the moderated stresses. Therefore, the sub-plate stack structure 110s having the pads 108s' can minimize stress applied to the vertical active patterns 140. As a result, variation of the vertical active patterns 140 can be minimized.

Referring to FIGS. 11A to 11C, a capping dielectric layer 115' may be formed on a substrate 100 having the pads 108s' of the stepped structure. The capping dielectric layer 115' covers the pads 108s' of the stepped structure. Furthermore, the capping dielectric layer 115' may fill the first trench 120. A top surface of the capping dielectric layer 115' may be planarized. The top surface of the capping dielectric layer 115' may be higher than an uppermost surface of the sub-plate stack structure 110s. Therefore, the capping dielectric layer 115' may cover the uppermost surface of the sub-plate stack structure 110s. In this case, the capping dielectric layer 115' may also cover upper surfaces of the vertical active patterns 140. The capping dielectric layer 115' may be formed of the same material as that of the capping dielectric layer 115 in the first embodiment of the inventive concept.

Figure 12A:
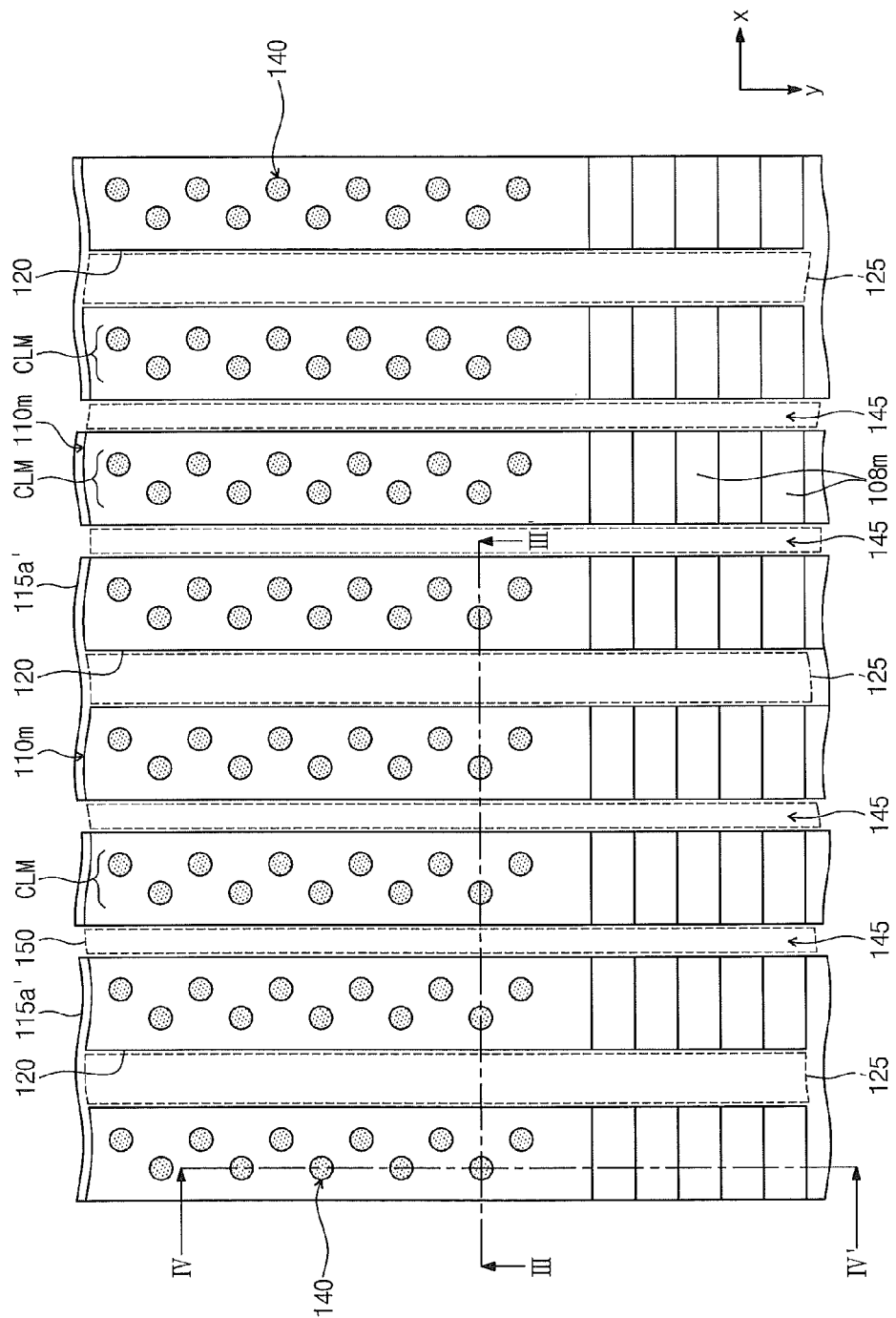
Figure 12B:
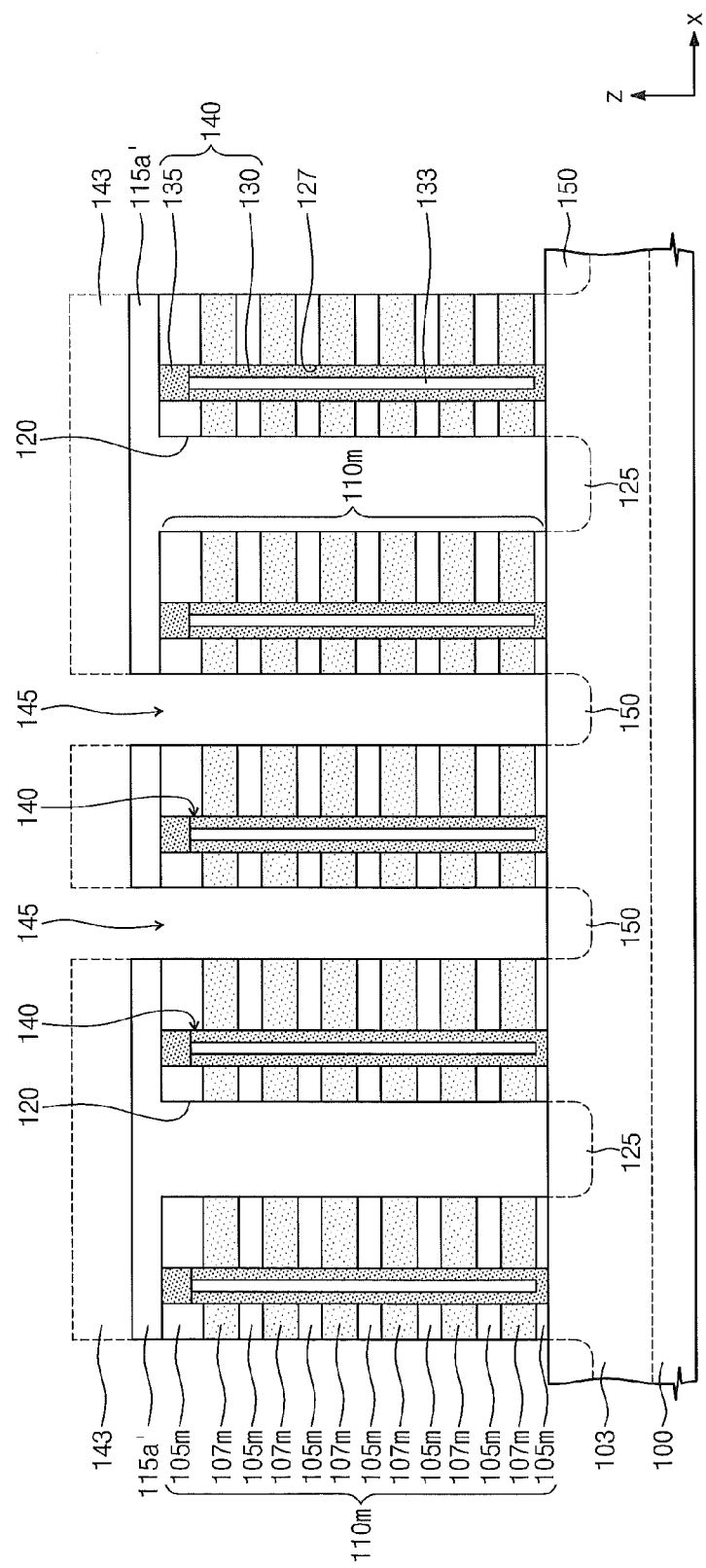

Referring to FIGS. 12A to 12C, at least one second trench 145 may be formed to divide each of the sub-plate stack structure 110s into a plurality of mold-stack structures 110m. For example, a second mask pattern 143 having a second opening may be formed on the capping dielectric layer 115'. The second opening may define the second trench 145. The second mask pattern 143 covers the vertical active patterns 140. Furthermore, the second mask pattern 143 may cover a portion of the capping dielectric layer 115' filling the first trench 120. The capping dielectric layer 115' and the sub-plate stack structure 110s may be sequentially etched using the second mask pattern 143 as an etch mask, such that the second trench 145 may be formed. Moreover, the capping dielectric pattern 115a' may be formed.

The mold-stack structure 110m may include a plurality of mold insulation patterns 105m and mold sacrificial patterns 107m that are stacked alternately and repeatedly. Also, the mold-stack structure 110m may include mold-pads 108m constituting a stepped structure. The mold-pads 108m may correspond to edges of the mold sacrificial patterns 107m in each of the mold-stack structures 110m, respectively. The capping dielectric pattern 115a' may cover the mold-pads 108m. Moreover, the capping dielectric pattern 115a' may fill the first trench 120. A second doped-region 150 may be formed in a well region 103 under the second trench 145. The second mask pattern 143 may be removed. The second mask pattern 143 may be removed after or before the second doped-region 150 is formed.

Figure 13A:
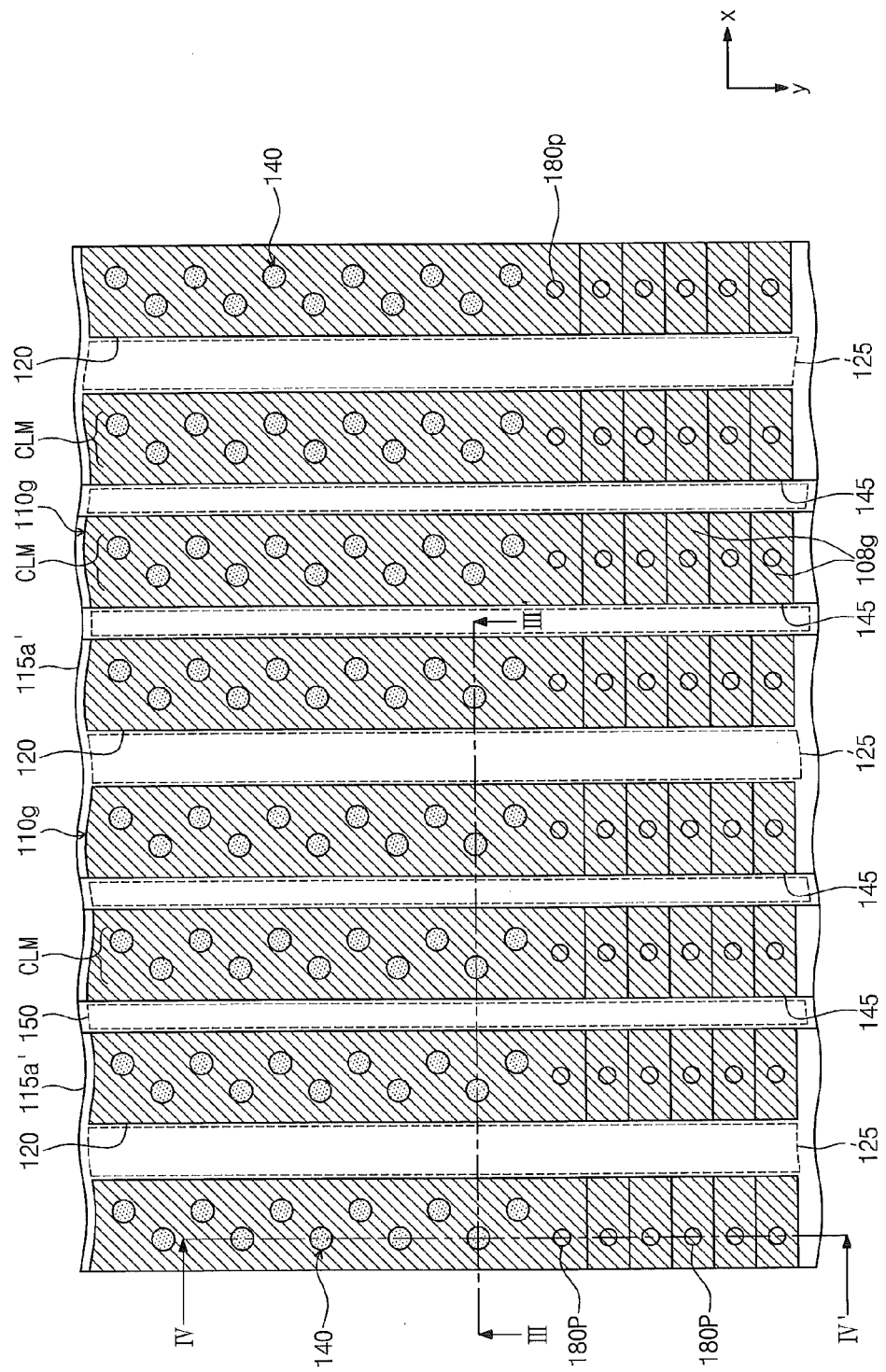
Figure 13B:
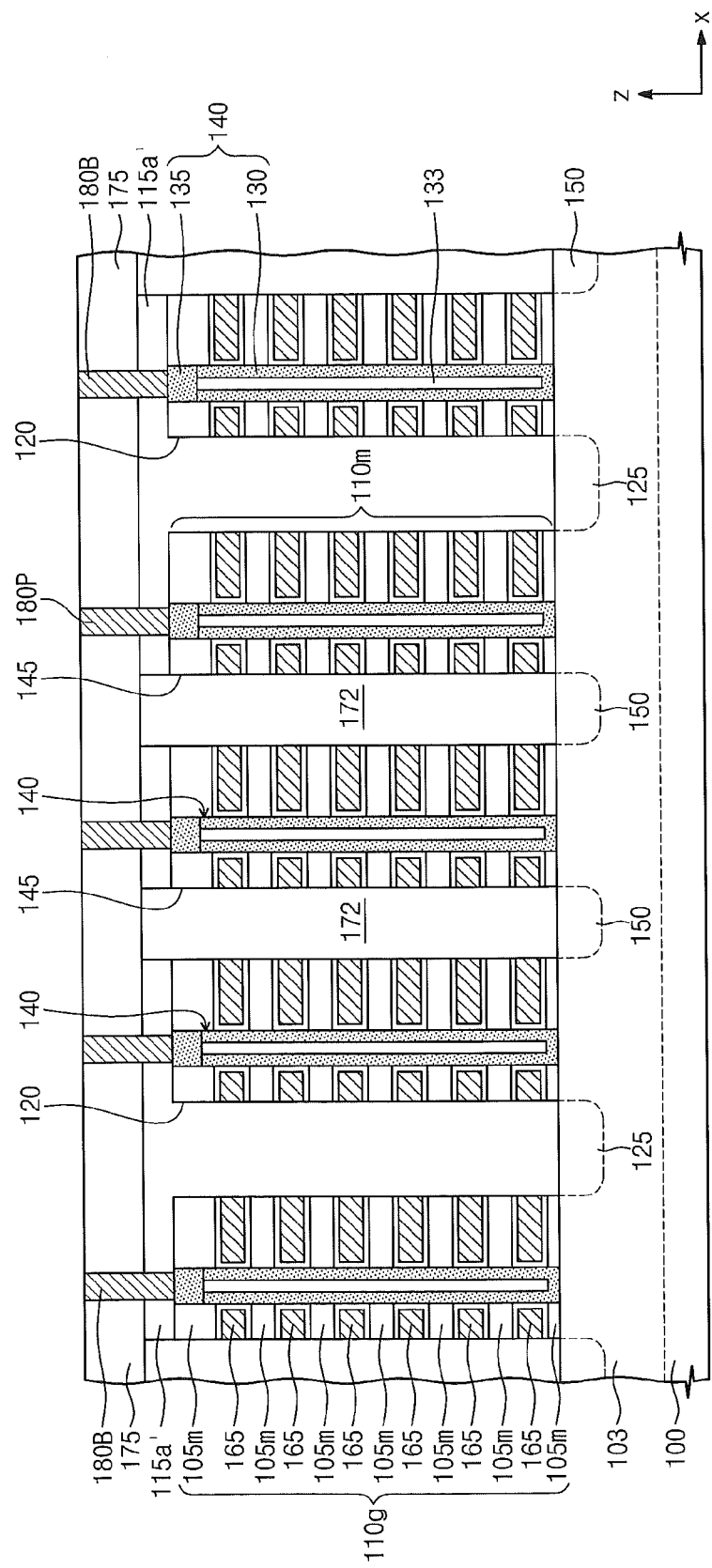
Figure 13C:
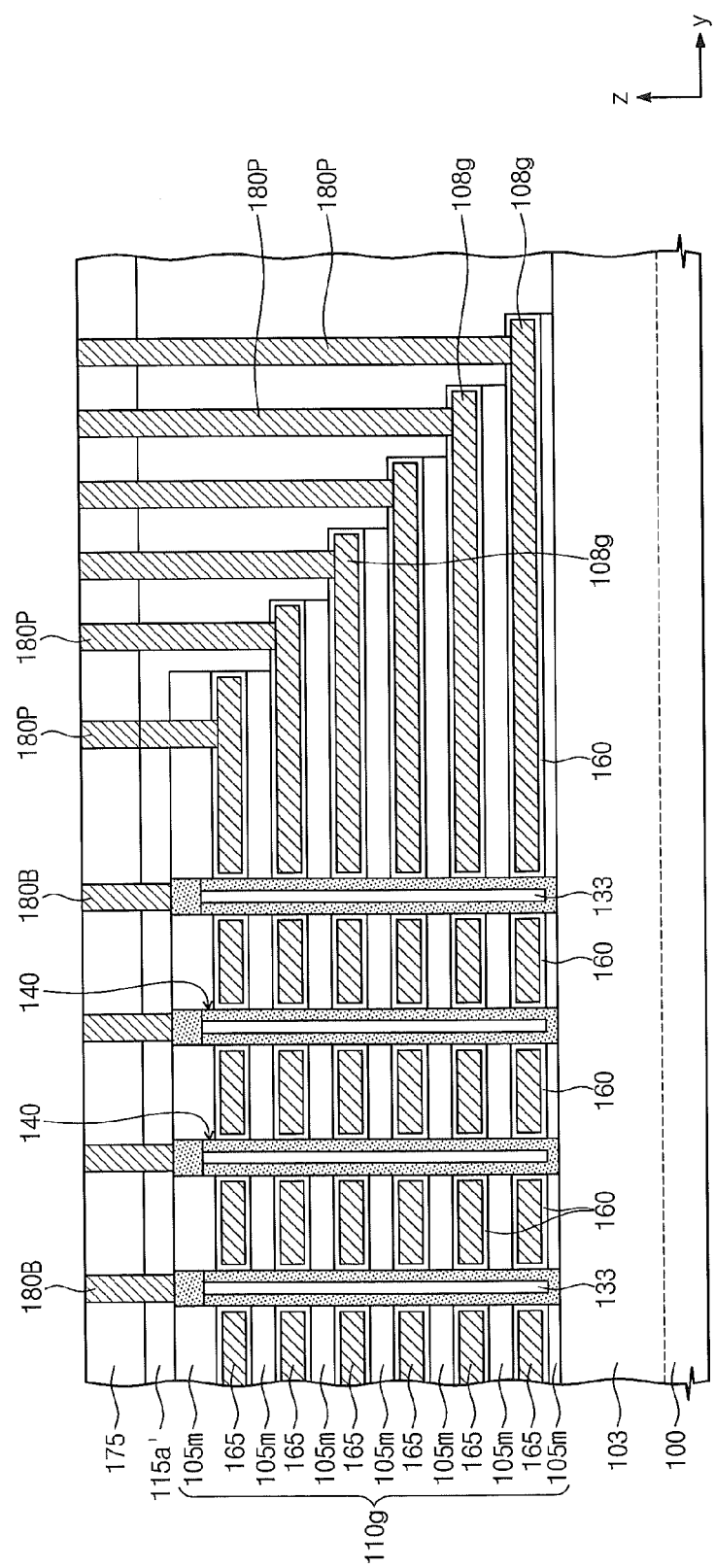

Referring to FIGS. 13A to 13C, a plurality of gap regions may be formed by removing the mold sacrificial patterns 107m, and then a plurality of gate patterns 165 may be formed in the gap regions, respectively. A multi-layered dielectric layer 160 may be foamed between side walls of each gate pattern 165 and vertical active pattern 140. According to an embodiment of the inventive concept, after formation of the gap region, and then the multi-layered dielectric layer 160 and the gate pattern 165 may be sequentially formed in the gap region. The gate stack structure 110g may include a plurality of mold insulation patterns 105m and a plurality of gate patterns 165 that are stacked alternately and repeatedly. As described above in the first embodiment of the inventive concept, due to pads 108m of the mold sacrificial patterns 107m, the gate patterns 165 in the gate stack structure 110g have conductive pads 108g constituting a stepped structure.

An isolation pattern 172 filling the second trench 145 may be formed. Then, an interlayer dielectric 175 may be formed over the substrate 100. A plurality of first contact plugs 180B respectively connected to the vertical active patterns 140 may be formed. According to an embodiment of the inventive concept, the first contact plug 180B may be connected to the vertical active pattern 140 through the interlayer dielectric layer 175 and the capping dielectric pattern 115a'. A plurality of second contact plugs 180P respectively connected to a plurality of conductive pads 108g may be formed. The second contact plug 180P may be connected to the conductive pad 108g through the interlayer dielectric layer 175 and the capping dielectric pattern 115a'. The bit lines 190B, the local interconnections 190L and the landing pads 190K that have been described above in the first embodiment of the inventive concept may be formed on the interlayer dielectric layer 175.

The 3D semiconductor memory device according to the above-described embodiments of the inventive concept may be implemented in various types of semiconductor packages. For example, the 3D semiconductor memory devices that are manufactured in the above-described methods according to the embodiments of the inventive concept may be packaged in types such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP), and Wafer-Level Processed Stack Package (WSP).

A package on which the 3D semiconductor memory devices manufactured in the above-described methods according to the embodiments of the inventive concept may further include a controller and/or a logic device for controlling the 3D semiconductor memory device.

In some embodiments according to the inventive concept, the plate stack structure having the stair-type pads may be divided into the plurality of sub-plate stack structures, and thereafter the vertical active pattern may be formed. In some embodiments according to the inventive concept, the plate stack structure having the vertical active pattern may be divided into the sub-plate stack structures, and then the pads of the stepped structure may be formed in the sub-plate stack structure. Accordingly, stress applied to the vertical active pattern can be minimized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a Three Dimensional (3D) semiconductor memory device, the method comprising:
   forming a plate stack structure comprising a plurality of plate insulation patterns and plate sacrificial patterns which are stacked alternately and repeatedly on a substrate;
   forming edges of the plate sacrificial patterns as pads included in a stepped structure;
   forming at least one first trench which divides the plate stack structure comprising the pads into a plurality of sub-plate stack structures;
   forming a plurality of vertical active patterns passing through each of the sub-plate stack structures; and
   forming at least one second trench which divides each of the sub-plate stack structures to provide a plurality of mold-stack structures, the method further comprising:
   forming a well region doped with a first conductive dopant, in the substrate;
   forming a first doped-region in the well region under the at least one first trench; and
   forming a second doped-region doped with a second conductive dopant, in the well region under the at least one second trench.

2. The method of claim 1, further comprising forming a capping dielectric layer which covers the pads, before the first trench is formed,
   wherein:
   the at least one first trench is formed by patterning the plate stack structure comprising the pads and the capping dielectric layer,
   the sub-plate stack structure comprises sub-pads constituting a stepped structure which are divided from the pads of the plate sacrificial patterns, and
   the at least one second trench is formed by patterning the sub-plate stack structure and a portion of the capping dielectric layer covering the sub-pads.

3. The method of claim 2, wherein:
   the mold-stack structure comprises a plurality of mold insulation patterns and mold sacrificial patterns which are stacked alternately and repeatedly, and
   the method further comprises:
   removing the mold sacrificial patterns to form a plurality of gap regions;
   forming a multi-layered dielectric layer on sidewalls of the plurality of gap regions; and
   forming a plurality of gate patterns in the gap regions on the multi-layered dielectric layer.

4. The method of claim 3, further comprising:
   forming a first isolation pattern filling the at least one first trench before the vertical active patterns are formed; and
   forming a second isolation pattern filling the at least one second trench after the gate patterns are formed.

5. The method of claim 1, wherein:
   the first and second trenches extend in a first direction,
   the at least one first trench has a first width in a second direction perpendicular to the first direction,
   the at least one second trench has a second width in the second direction, and
   the first width differs from the second width.

6. The method of claim 1, wherein:
   the vertical active patterns passing though each of the sub-plate stack structures are divided into a plurality of column groups, in a plan view,
   the at least one second trench is formed between a pair of the column groups adjacent to each other, and
   the vertical active patterns in each of the column groups pass through each of the mold-stack structures.

7. The method of claim 6, wherein:
   the vertical active patterns in the each of the column groups are arranged in a first direction, and
   odd-numbered vertical active patterns are offset in a second direction, perpendicular to the first direction relative to even-numbered vertical active patterns.

8. The method of claim 1, wherein:
   the first doped-region is doped with the first conductive dopant, and
   a dopant concentration of the first doped-region is higher than a dopant concentration of the well region.

9. The method of claim 1, wherein the second doped-region is doped with the second conductive dopant.

10. A method of manufacturing a Three Dimensional (3D) semiconductor memory device, the method comprising:
    forming a plate stack structure including a plurality of insulation patterns and sacrificial patterns which are stacked alternately and repeatedly on a substrate;
    forming edges of the sacrificial patterns as pads included in a stepped structure;
    forming at least one first trench which divides the plate stack structure comprising the pads into a plurality of sub-plate stack structures, the first trench having a first width;
    forming a plurality of vertical active patterns passing through each of the sub-plate stack structures;
    forming a plurality of second trenches which divides each of the sub-plate stack structures to provide a plurality of mold-stack structures, the second trenches having a second width smaller than the first width;
    removing the sacrificial patterns of the mold-stack structures exposed by the second trenches to form a plurality of gap regions between the insulating patterns, the gap regions partially exposing the vertical active patterns; and
    forming a plurality of gate patterns in the gap regions, wherein the at least one first trench is disposed between the second trenches adjacent to each other.

* * * * *